(12) United States Patent
Cho et al.

(10) Patent No.: US 11,489,021 B2
(45) Date of Patent: Nov. 1, 2022

(54) COLOR CONVERSION SUBSTRATE AND DISPLAY DEVICE

(71) Applicant: Samsung Display Co., Ltd., Yongin-si (KR)

(72) Inventors: Yoon Hyeung Cho, Yongin-si (KR); Yo Han Kim, Seoul (KR); Byoung Duk Lee, Seongnam-si (KR); Yong Tack Kim, Yongin-si (KR); Jong Jin Park, Cheonan-si (KR); Yun Ah Chung, Seoul (KR); Young Cheol Joo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 204 days.

(21) Appl. No.: 16/774,359

(22) Filed: Jan. 28, 2020

(65) Prior Publication Data
US 2020/0295090 A1    Sep. 17, 2020

(30) Foreign Application Priority Data

Mar. 15, 2019  (KR) .......................... 10-2019-0030048

(51) Int. Cl.
*H01L 27/32* (2006.01)
*H01L 51/50* (2006.01)
*H01L 51/52* (2006.01)

(52) U.S. Cl.
CPC .......... *H01L 27/322* (2013.01); *H01L 51/502* (2013.01); *H01L 51/5206* (2013.01); *H01L 51/5221* (2013.01); *H01L 51/5237* (2013.01)

(58) Field of Classification Search
CPC ............... H01L 51/502; H01L 51/5206; H01L 51/5221; H01L 51/5237; H01L 27/322
See application file for complete search history.

(56) References Cited

U.S. PATENT DOCUMENTS

2017/0031205 A1* 2/2017 Lee .................. G02F 1/133514
2020/0227484 A1* 7/2020 Lin ..................... H01L 51/0096

FOREIGN PATENT DOCUMENTS

KR    10-2015-0085732 A    7/2015
KR    10-2018-0050480 A    5/2018
KR    10-2018-0064616 A    6/2018

* cited by examiner

*Primary Examiner* — Sue A Purvis
*Assistant Examiner* — Jordan M Klein
(74) *Attorney, Agent, or Firm* — Lewis Roca Rothgerber Christie LLP

(57) ABSTRACT

A color conversion substrate includes a base including a first light transmitting region and a light shielding region around the first light transmitting region; a first color filter on the base in the first light transmitting region; a first wavelength conversion pattern in a first microcavity on the first color filter including a first wavelength shifter; and a light shielding member on the base and in the light shielding region. The first microcavity includes an open side, and the light shielding member directly contacts the first wavelength conversion pattern at the open side of the first microcavity.

18 Claims, 31 Drawing Sheets

COLOR CONVERSION SUBSTRATE AND DISPLAY DEVICE

CROSS-REFERENCE TO RELATED APPLICATION

This application claims priority to and the benefit of Korean Patent Application No. 10-2019-0030048, filed on Mar. 15, 2019, in the Korean Intellectual Property Office, the disclosure of which is incorporated herein by reference in its entirety.

BACKGROUND

1. Field

The present disclosure relates to a color conversion substrate and a display device.

2. Description of the Related Art

Display devices are becoming increasingly important with the development of multimedia. Accordingly, various display devices such as liquid crystal display devices (LCDs) and organic light emitting diode display devices (OLEDs) are being used.

Of the display devices, a self-light emitting display device includes a self-light emitting element such as an organic light emitting diode. The self-light emitting element may include two electrodes facing each other and a light emitting layer interposed between the two electrodes. When the self-light emitting element is, for example, an organic light emitting diode, electrons and holes provided from the two electrodes may be recombined in the light emitting layer to generate excitons. As the generated excitons change from an excited state to a ground state, light may be emitted.

Since such self-light emitting display devices do not need a light source, they are low in power consumption, can be made lightweight and thin, and have a wide viewing angle, high luminance and contrast, and fast response speed. Due to these high-quality characteristics, they are drawing attention as next-generation display devices.

As one way to make each pixel of a display device uniquely display one primary color, a color conversion pattern or a wavelength conversion pattern may be placed in each pixel on a light path extending from a light source to a viewer.

SUMMARY

Aspects of the present disclosure provide a color conversion substrate and a display device having improved display quality.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a color conversion substrate includes a base including first light transmitting region and a light shielding region around the first light transmitting region; a first color filter on the base and in the first light transmitting region; a first wavelength conversion pattern in a first microcavity on the first color filter comprises a first wavelength shifter; and a light shielding member on the base and in the light shielding region. The first microcavity includes an open side, and the light shielding member directly contacts the first wavelength conversion pattern at the open side of the first microcavity.

An embodiment of a display device includes a first base including a first light emitting region, a second light emitting region, and a non-light emitting region surrounding the first light emitting region and the second light emitting region; a first anode on the first base and in the first light emitting region; a second anode on the first base and in the second light emitting region; a light emitting layer on the first anode and the second anode; a cathode on the light emitting layer; a filler on the cathode; a second base on the filler; a first color filter on a surface of the second base facing the first base and overlapping the first light emitting region; a second color filter on the surface of the second base and overlapping the second light emitting region; a first wavelength conversion pattern in a first microcavity on the first color filter and includes a first wavelength shifter; a second wavelength conversion pattern in a second microcavity on the second color filter and includes a second wavelength shifter; and a light shielding member on the surface of the second base and overlapping the non-light emitting region. The first microcavity and the second microcavity each include an open side. The light shielding member directly contacts the first wavelength conversion pattern at the open side of the first microcavity and directly contacts the second wavelength conversion pattern at the open side of the second microcavity.

An embodiment of a display device includes a first base including a first light emitting region, a second light emitting region, and a non-light emitting region surrounding the first light emitting region and the second light emitting region; a first anode on the first base and in the first light emitting region; a second anode on the first base and in the second light emitting region; a light emitting layer on the first anode and the second anode; a cathode on the light emitting layer; a thin-film encapsulation layer on the cathode; a first microcavity on the thin-film encapsulation layer and in the first light emitting region; a second microcavity on the thin-film encapsulation layer and in the second light emitting region; a first wavelength conversion pattern in the first microcavity and includes a first wavelength shifter; a second wavelength conversion pattern in the second microcavity and includes a second wavelength shifter; a first color filter on the first wavelength conversion pattern; a second color filter on the second wavelength conversion pattern; and a light shielding member on the thin-film encapsulation layer and in the non-light emitting region. The first microcavity and the second microcavity each include an open side. The light shielding member directly contacts the first wavelength conversion pattern at the open side of the first microcavity and directly contacts the second wavelength conversion pattern at the open side of the second microcavity.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
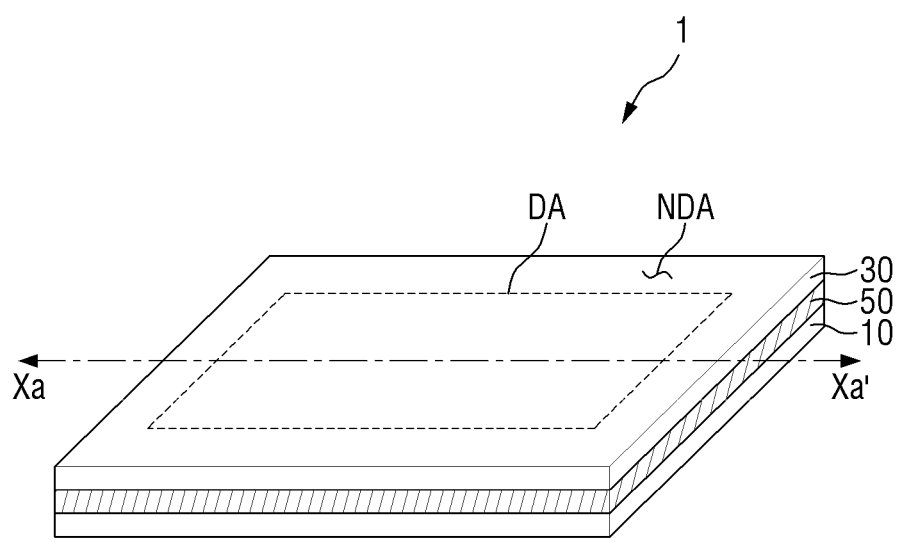
FIG. 1 is a perspective view of a display device according to an embodiment.
Figure 1:
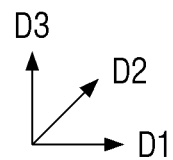

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments are described herein with reference to plan and cross-section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present disclosure.

Hereinafter, embodiments of the present disclosure will be described with reference to the drawings.

Figure 2:
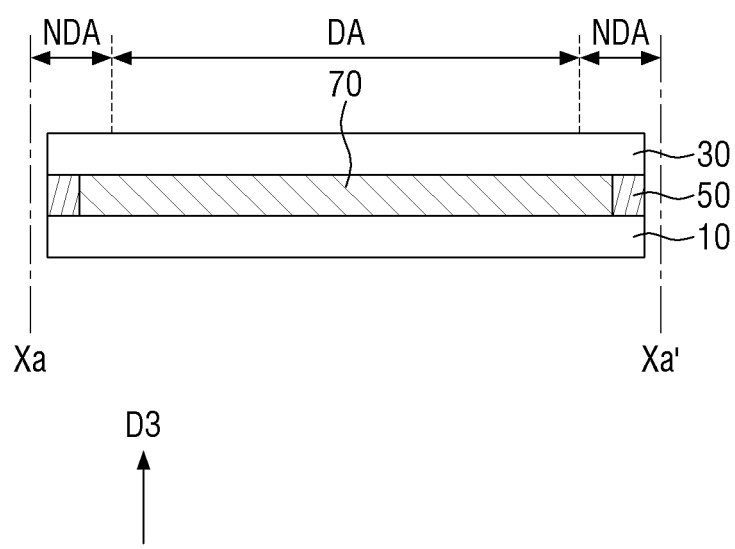
FIG. 2 is a schematic cross-sectional view of the display device taken along Xa-Xa' of FIG. 1.

FIG. 1 is a perspective view of a display device 1 according to an embodiment. FIG. 2 is a schematic cross-sectional view of the display device 1 taken along Xa-Xa' of FIG. 1.

Referring to FIGS. 1 and 2, the display device 1 is applicable to various electronic devices including small and medium-sized electronic devices such as a tablet personal computer (PC), a smartphone, a car navigation unit, a camera, a center information display (CID) provided in a car, a wristwatch-type electronic device, a personal digital assistant (PDA), a portable multimedia player (PMP) and a game machine, and medium and large-sized electronic devices such as a television, an external billboard, a monitor, a PC and a notebook computer. However, these are just examples, and the display device 1 is also applicable to other electronic devices without departing from the concept of the present disclosure.

In some embodiments, the display device 1 may be rectangular in plan view. The display device 1 may include two first sides extending in a first direction D1 and two second sides extending in a second direction D2 intersecting the first direction D1. Each corner where a first side and a second side of the display device 1 meet may be right-angled, but may also be curved (e.g., rounded). In some embodiments, the first sides may be shorter than the second sides. The planar shape of the display device 1 is not limited to the above example and may also be a circle or other shapes.

The display device 1 may include a display area DA which displays an image and a non-display area NDA which does not display an image. In some embodiments, the non-display area NDA may be located around the display area DA and may surround the display area DA.

Unless otherwise defined, the terms "on," "upper," "above," "top," and "upper surface" used herein denote a direction in which an arrow indicating a third direction D3 that intersects the first direction D1 and the second direction D2 points in the drawings, and the terms "under," "lower," "below," "bottom," and "lower surface" used herein denote a direction opposite to the direction in which the arrow indicating the third direction D3 points in the drawings.

As for the schematic stacked structure of the display device 1, in some embodiments, the display device 1 includes a first substrate 10 and a second substrate 30 facing the first substrate 10 and may further include a sealing portion 50 bonding the first substrate 10 and the second substrate 30 and a filler 70 between the sealing portion 50 and filling a space between the first substrate 10 and the second substrate 30.

The first substrate 10 may include elements and circuits (e.g., pixel circuits such as switching elements) for displaying an image, a pixel defining layer defining light emitting regions and a non-light emitting region in the display area DA, and self-light emitting elements. In an exemplary embodiment, the self-light emitting elements may include at least one of an organic light emitting diode, a quantum dot light emitting diode, an inorganic-based micro light emitting diode (e.g., a micro LED), and an inorganic-based nano light emitting diode (e.g., a nano LED). For ease of description, the self-light emitting elements will be described below as organic light emitting diodes, but they are not limited thereto.

The second substrate 30 may be located on the first substrate 10 and may face the first substrate 10. In some embodiments, the second substrate 30 may include a color conversion pattern that converts the color of incident light. That is, the second substrate 30 may be a color conversion substrate. In some embodiments, the color conversion pattern may include at least any one of a color filter or a wavelength conversion pattern. The second substrate and the color conversion substrate will hereinafter be interchangeably used and indicated by the same reference numeral.

The sealing portion 50 may be located between the first substrate 10 and the second substrate 30 in the non-display area NDA. The sealing portion 50 may be disposed in the non-display area NDA along edges of the first substrate 10 and the second substrate 30 to surround the display area DA in plan view. The first substrate 10 and the second substrate 30 may be bonded to each other by the sealing portion 50.

In some embodiments, the sealing portion 50 may be made of an organic material. For example, the sealing portion 50 may be made of epoxy resin.

The filler 70 may be located in the space between the first substrate 10 and the second substrate 30 surrounded by the sealing portion 50. The filler 70 may fill the space between the first substrate 10 and the second substrate 30.

In some embodiments, the filler 70 may be made of a light transmitting material. In some embodiments, the filler 70 may be made of an organic material. For example, the filler 70 may be made of a silicon-based organic material or an epoxy-based organic material. In an embodiment, the filler 70 may be omitted.

Figure 3:
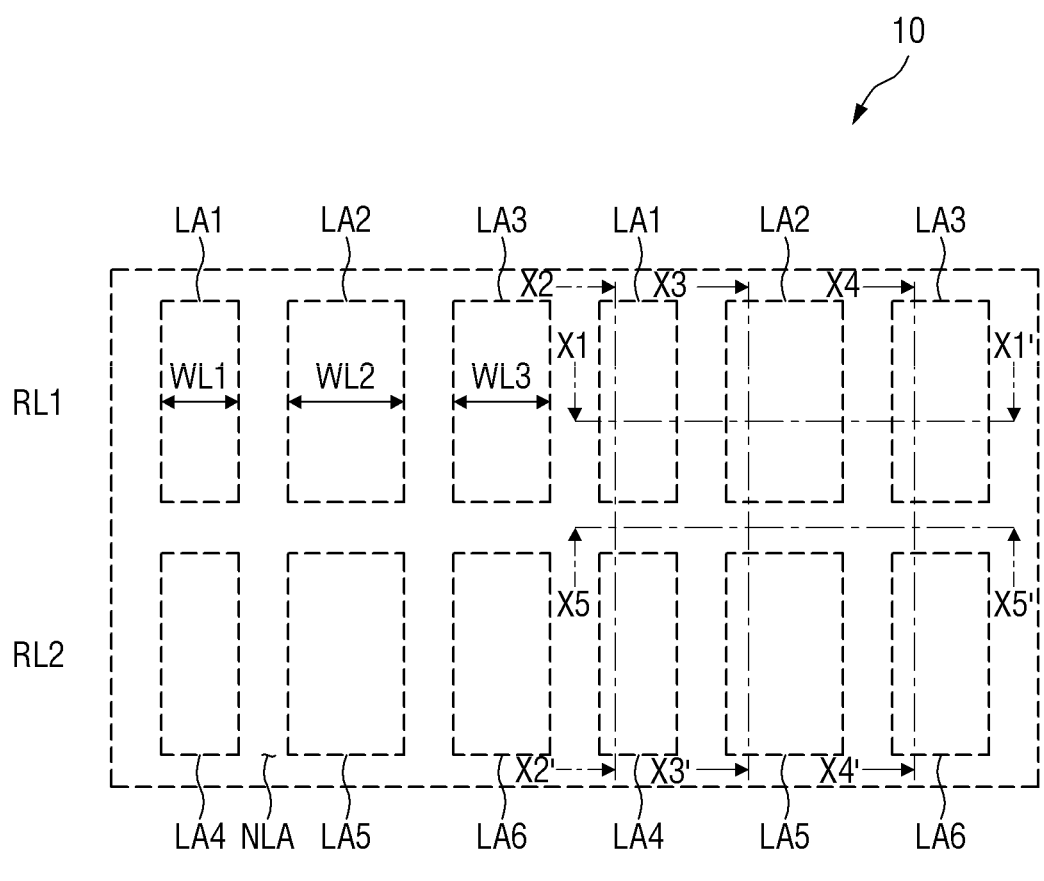
FIG. 3 is a schematic plan view of a display substrate in a display area of the display device illustrated in FIGS. 1 and 2.
Figure 4:
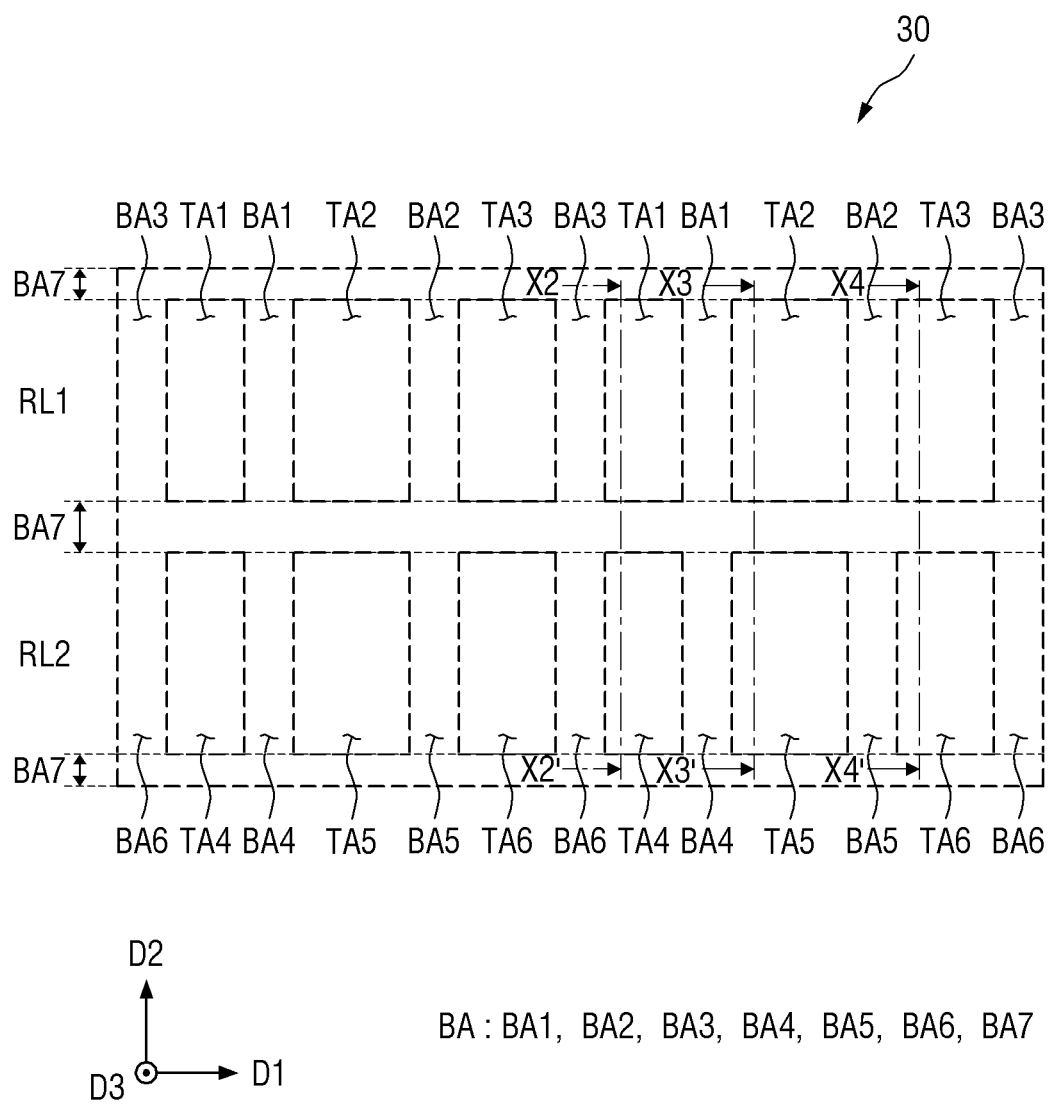
FIG. 4 is a schematic plan view of a second substrate in the display area of the display device illustrated in FIGS. 1 and 2.

FIG. 3 is a schematic plan view of the display substrate 10 illustrated in FIGS. 1 and 2, more specifically, is a schematic plan view of the display substrate 10 in the display area DA. FIG. 4 is a schematic plan view of the second substrate 30 in the display area DA of the display device 1 illustrated in FIGS. 1 and 2.

Referring to FIGS. 3 and 4 in addition to FIGS. 1 and 2, a plurality of light emitting regions LA1 through LA6 and a non-light emitting region NLA may be defined in the first substrate 10 in the display area DA. Each of the light emitting regions LA1 through LA6 may be a region where light generated by a light emitting element of the first substrate 10 is emitted out of the first substrate 10, and the non-light emitting region NLA may be a region where light is not emitted out of the first substrate 10.

In some embodiments, light emitted out of the first substrate 10 in each of the light emitting regions LA1 through LA6 may be light of a first color. In some embodiments, the light of the first color may be blue light and may have a peak wavelength in the range of about 440 nm to about 480 nm.

In some embodiments, a first light emitting region LA1, a second light emitting region LA2, and a third light emitting region LA3 may be sequentially repeated along the first direction D1 in a first row RL1 of the first substrate 10 in the display area DA. In addition, a fourth light emitting region LA4, a fifth light emitting region LA5, and a sixth light emitting region LA6 may be sequentially repeated along the first direction D1 in a second row RL2 adjacent to the first row RL1 along the second direction D2.

In some embodiments, a first width WL1 of the first light emitting region LA1 measured along the first direction D1 may be smaller than each of a second width WL2 of the second light emitting region LA2 and a third width WL3 of the third light emitting region LA3 measured along the first direction D1. In some embodiments, the second width WL2 of the second light emitting region LA2 and the third width WL3 of the third light emitting region LA3 may be different from each other. For example, the second width WL2 of the second light emitting region LA2 may be greater than the third width WL3 of the third light emitting region LA3. In addition, in some embodiments, the area of the first light emitting region LA1 may be smaller than each of the area of the second light emitting region LA2 and the area of the third light emitting region LA3, or the area of the first light emitting region LA1 may be larger than each of the area of the second light emitting region LA2 and the area of the third light emitting region LA3.

In some embodiments, the fourth light emitting region LA4 adjacent to the first light emitting region LA1 along the second direction D2 is different from the first light emitting region LA1 only in that it is located in the second row RL2 and may be the same or substantially the same as the first light emitting region LA1 in width, area, and the structure of elements disposed in a region.

Similarly, in some embodiments, the second light emitting region LA2 and the fifth light emitting region LA5 adjacent to each other along the second direction D2 may have the same or substantially the same structure, and the third light emitting region LA3 and the sixth light emitting region LA6 adjacent to each other along the second direction D2 may have the same or substantially the same structure.

A plurality of light transmitting regions TA1 through TA6 and a light shielding region BA may be defined in the second substrate 30 in the display area DA. Each of the light transmitting regions TA1 through TA6 may be a region where light emitted from the first substrate 10 is transmitted through the second substrate 30 and provided to the outside of the display device 1. The light shielding region BA may be a region through which light emitted from the first substrate 10 is not transmitted.

In some embodiments, a first light transmitting region TA1, a second light transmitting region TA2, and a third light transmitting region TA3 may be sequentially repeated along the first direction D1 in a first row RL1 of the second substrate 30 in the display area DA. The first light transmitting region TA1 may correspond to the first light emitting region LA1 or may overlap (at least partially) the first light emitting region LA1. Similarly, the second light transmitting region TA2 may correspond to or overlap (at least partially) the second light emitting region LA2, and the third light transmitting region TA3 may correspond to or overlap (at least partially) the third light emitting region LA3.

In some embodiments, light of the first color provided from the first substrate 10 may be emitted to the outside of the display device 1 through the first light transmitting region TA1, the second light transmitting region TA2 and the third light transmitting region TA3. Light emitted out of the display device 1 in the first light transmitting region TA1 is referred to as first output light, light emitted out of the display device 1 in the second light transmitting region TA2 is referred to as second output light, and light emitted out of the display device 1 in the third light transmitting region TA3 is referred to as third output light. The first output light may be light of the first color, the second output light may be light of a second color different from the first color, and the third output light may be light of a third color different from both the first color and the second color. In some embodiments, the light of the first color may be blue light having a peak wavelength in the range of about 440 nm to about 480 nm as described above, and the light of the second color may be red light having a peak wavelength in the range of about 610 nm to about 650 nm. In addition, the light of the third color may be green light having a peak wavelength in the range of about 510 nm to about 550 nm.

A fourth light transmitting region TA4, a fifth light transmitting region TA5, and a sixth light transmitting region TA6 may be sequentially repeated along the first direction D1 in a second row RL2 adjacent to the first row RL1 along the second direction D2. The fourth light transmitting region TA4 may correspond to or overlap (at least partially) the fourth light emitting region LA4, the fifth light transmitting region TA5 may correspond to or overlap (at least in part) the fifth light emitting region LA5, and the sixth light transmitting region TA6 may correspond to or overlap (at least in part) the sixth light emitting region LA6.

In some embodiments, similarly to the first light emitting region LA1, the second light emitting region LA2 and the third light emitting region LA3, a first width WT1 of the first light transmitting region TA measured along the first direction D1 may be smaller than each of a second width WT2 of the second light transmitting region TA2 and a third width WT3 of the third light transmitting region TA3 measured along the first direction D1. In some embodiments, the second width WT2 of the second light transmitting region TA2 and the third width WT3 of the third light transmitting region TA3 may be different from each other. For example, the second width WT2 of the second light transmitting region TA2 may be greater than the third width WT3 of the third light transmitting region TA3. In addition, in some embodiments, the area of the first light transmitting region TA1 may be smaller than each of the area of the second light transmitting region TA2 and the area of the third light transmitting region TA3, or the area of the first light transmitting region TA1 may be larger than each of the area of the second light transmitting region TA2 and the area of the third light transmitting region TA3.

In some embodiments, the first light transmitting region TA1 and the fourth light transmitting region TA4 adjacent to each other along the second direction D2 may be the same or substantially the same in width, area, the structure of elements disposed in a region, and the color of light emitted out of the display device 1.

Similarly, the second light transmitting region TA2 and the fifth light transmitting region TA5 adjacent to each other along the second direction D2 may have the same or substantially the same structure and may be the same or substantially the same in the color of light emitted out of the display device 1. In addition, the third light transmitting region TA3 and the sixth light transmitting region TA6 adjacent to each other along the second direction D2 may have the same or substantially the same structure and may be the same or substantially the same in the color of light emitted out of the display device 1.

The light shielding region BA may be located around the light transmitting regions TA1 through TA6 of the second substrate 30 in the display area DA. In some embodiments, the light shielding region BA may be divided into a first light shielding region BA1, a second light shielding region BA2, a third light shielding region BA3, a fourth light shielding region BA4, a fifth light shielding region BA5, a sixth light shielding region BA6, and a seventh light shielding region BA7.

The first light shielding region BA1 may be located between the first light transmitting region TA1 and the second light transmitting region TA2 along the first direction D1, the second light shielding region BA2 may be located between the second light transmitting region TA2 and the third light transmitting region TA3 along the first direction D1, and the third light shielding region BA3 may be located between the third light transmitting region TA3 and the first light transmitting region TA1 along the first direction D1.

The fourth light shielding region BA4 may be located between the fourth light transmitting region TA4 and the fifth light transmitting region TA5 along the first direction D1, the fifth light shielding region BA5 may be located between the fifth light transmitting region TA5 and the sixth light transmitting region TA6 along the first direction D1, and the sixth light shielding region BA6 may be located between the sixth light transmitting region TA6 and the fourth light transmitting region TA4 along the first direction D1.

The seventh light shielding region BA7 may be located between the first row RL1 and the second row RL2 adjacent to each other along the second direction D2.

The structure of the display device 1 will now be described in more detail.

Figure 5:
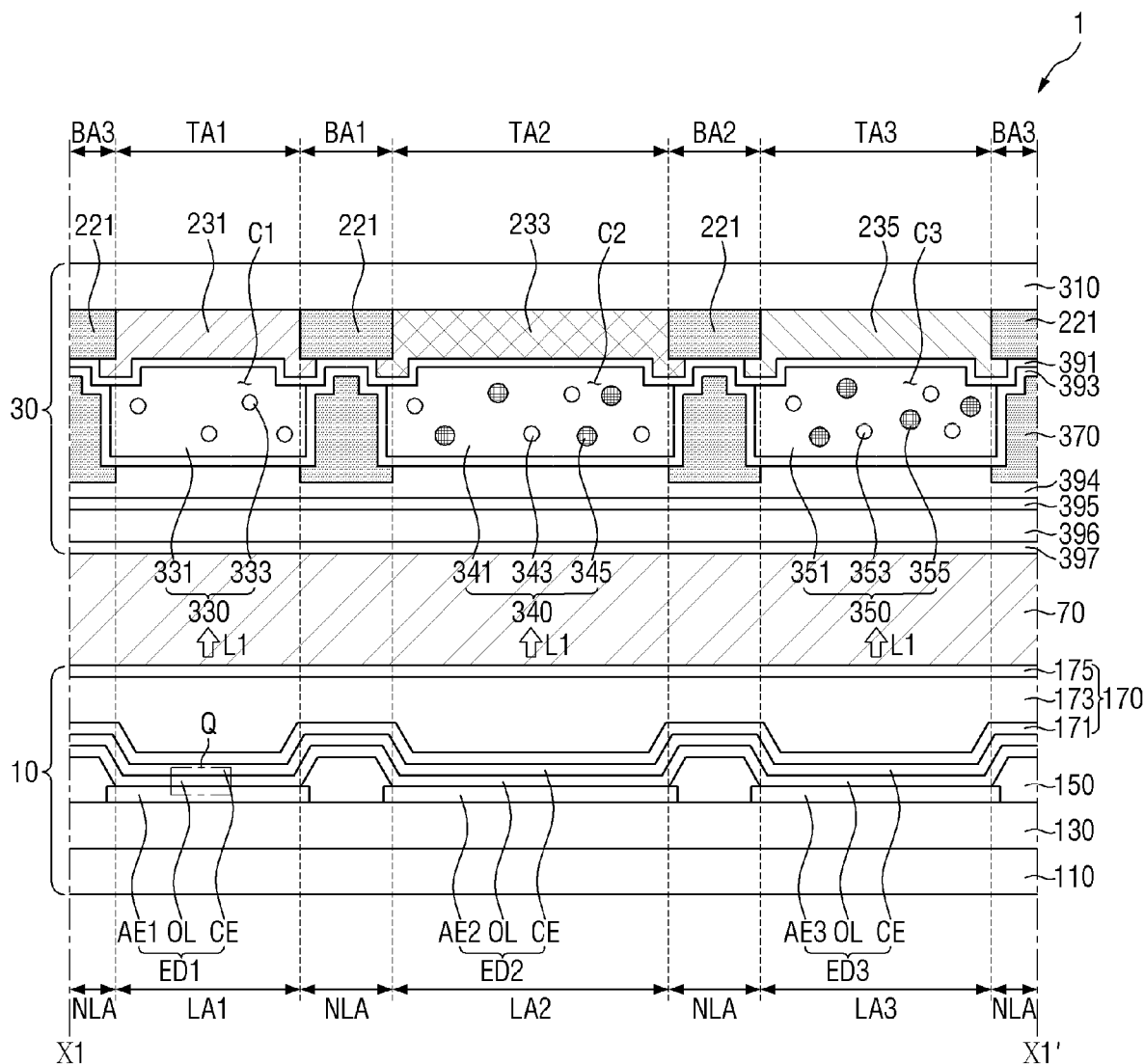
FIG. 5 is a cross-sectional view of the display device according to the embodiment, taken along X1-X1' of FIGS. 3 and 4.
Figure 6:
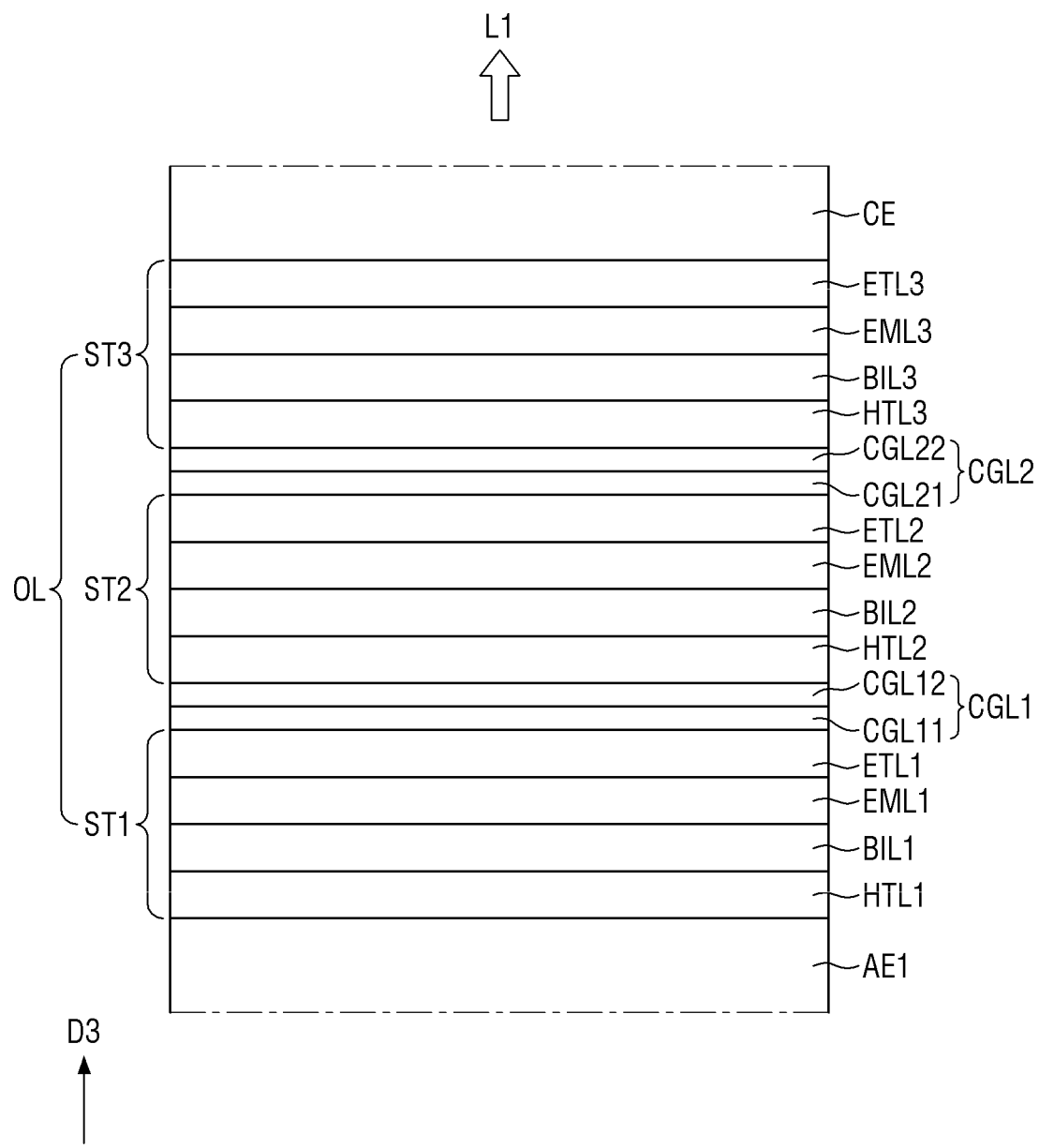
FIG. 6 is an enlarged cross-sectional view of portion Q of FIG. 5.
Figure 7:
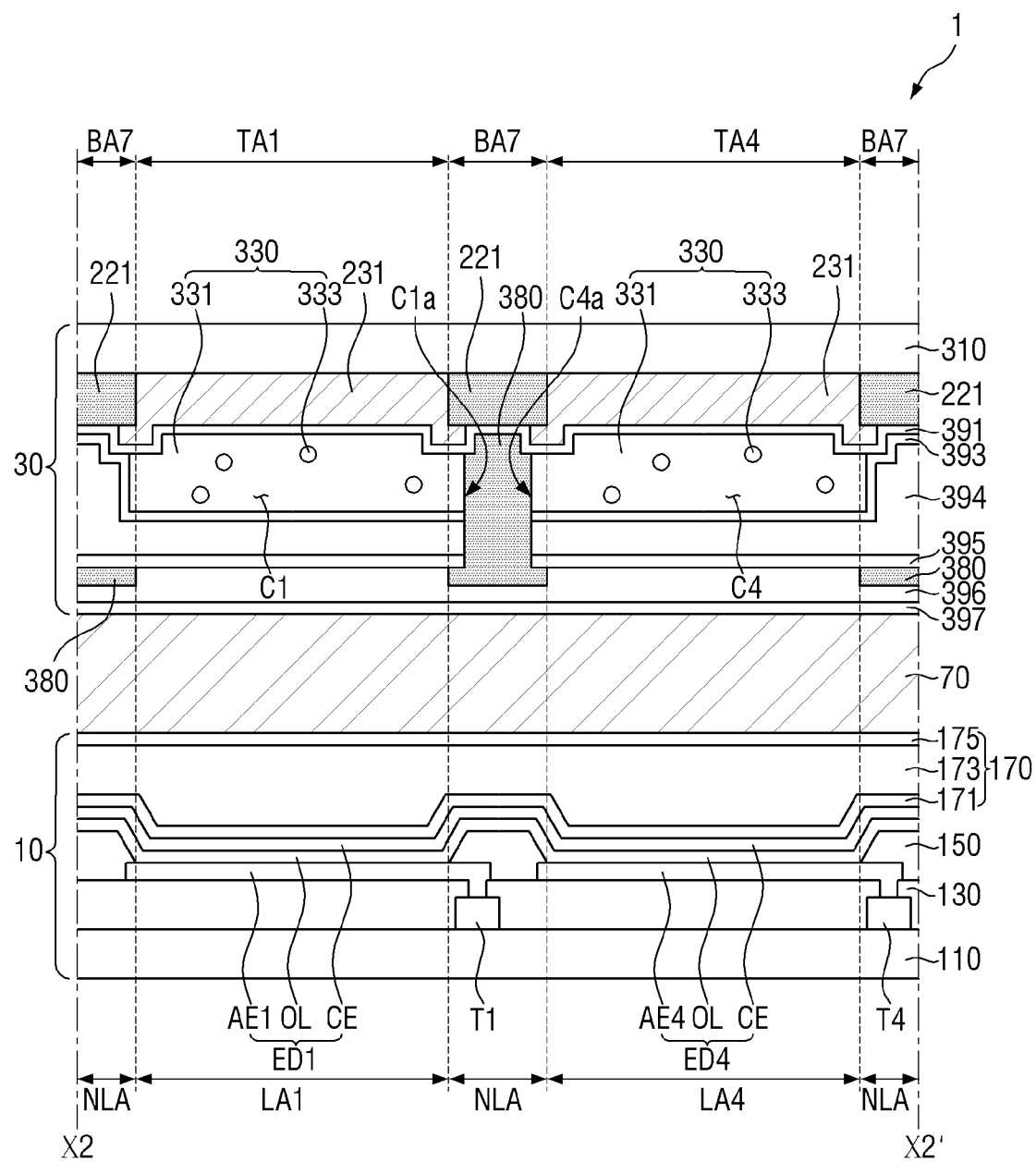
FIG. 7 is a cross-sectional view of the display device according to the embodiment, taken along X2-X2' of FIGS. 3 and 4.
Figure 8:
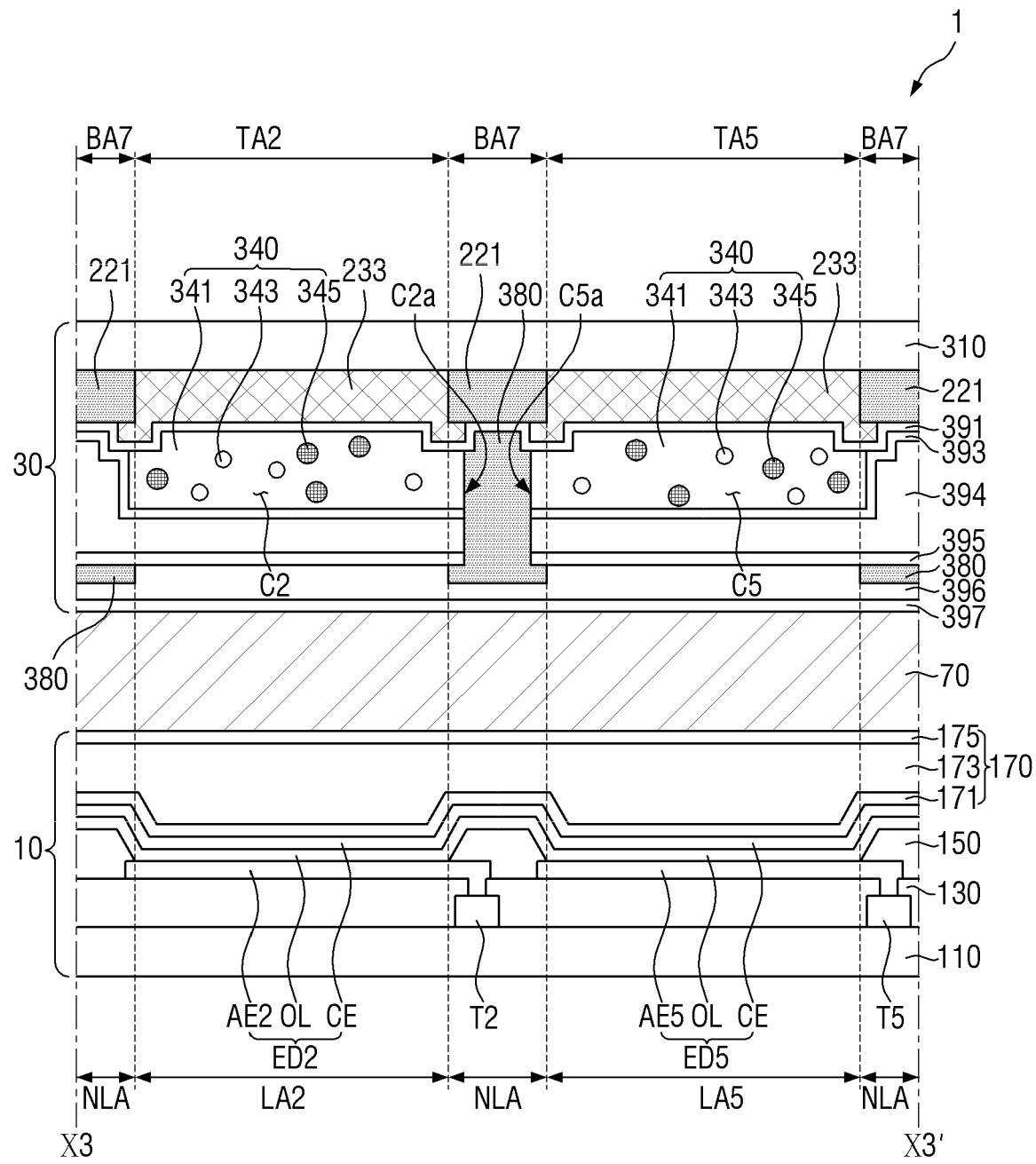
FIG. 8 is a cross-sectional view of the display device according to the embodiment, taken along X3-X3' of FIGS. 3 and 4.
Figure 9:
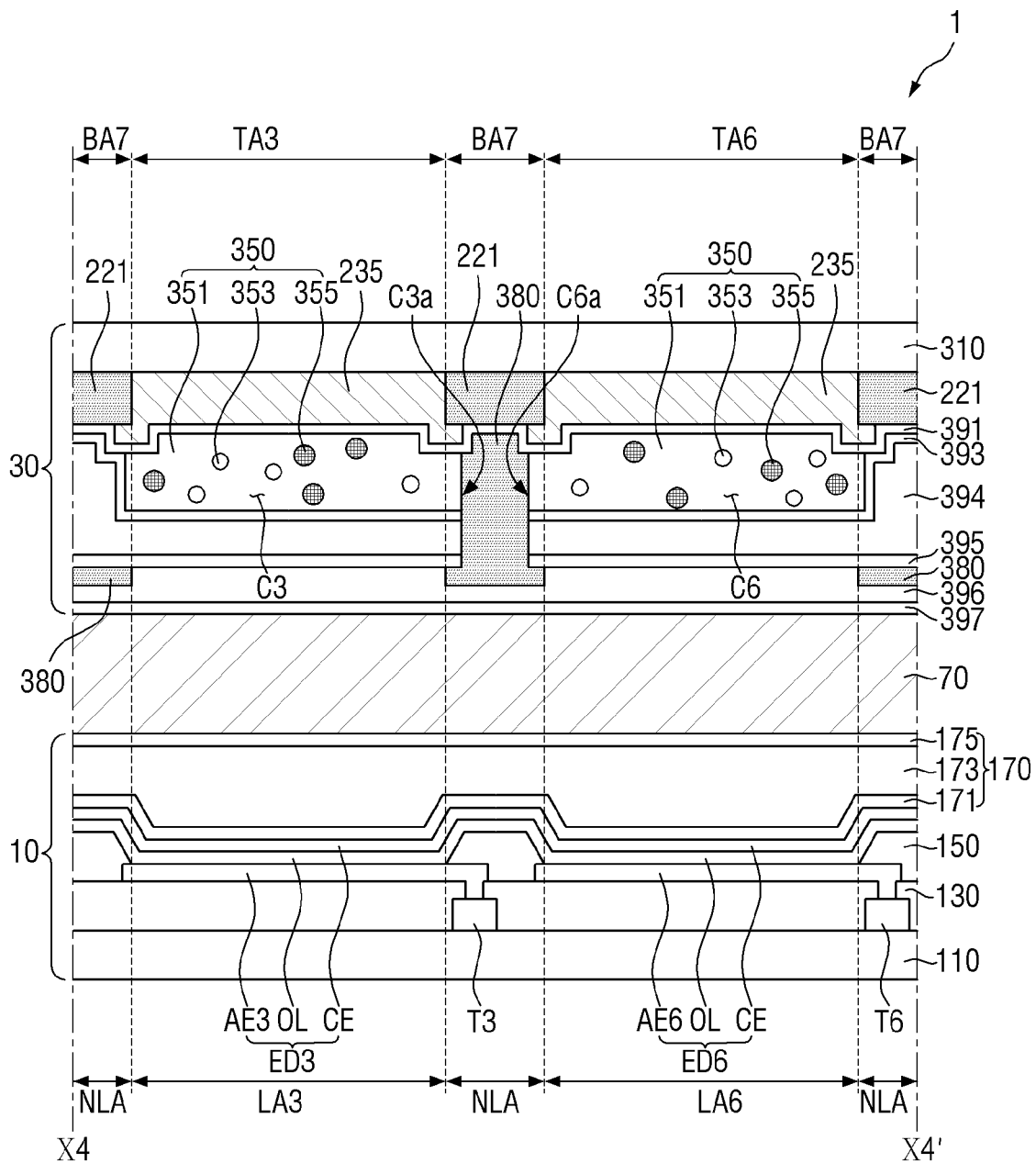
FIG. 9 is a cross-sectional view of the display device according to the embodiment, taken along X4-X4' of FIGS. 3 and 4.
Figure 10:
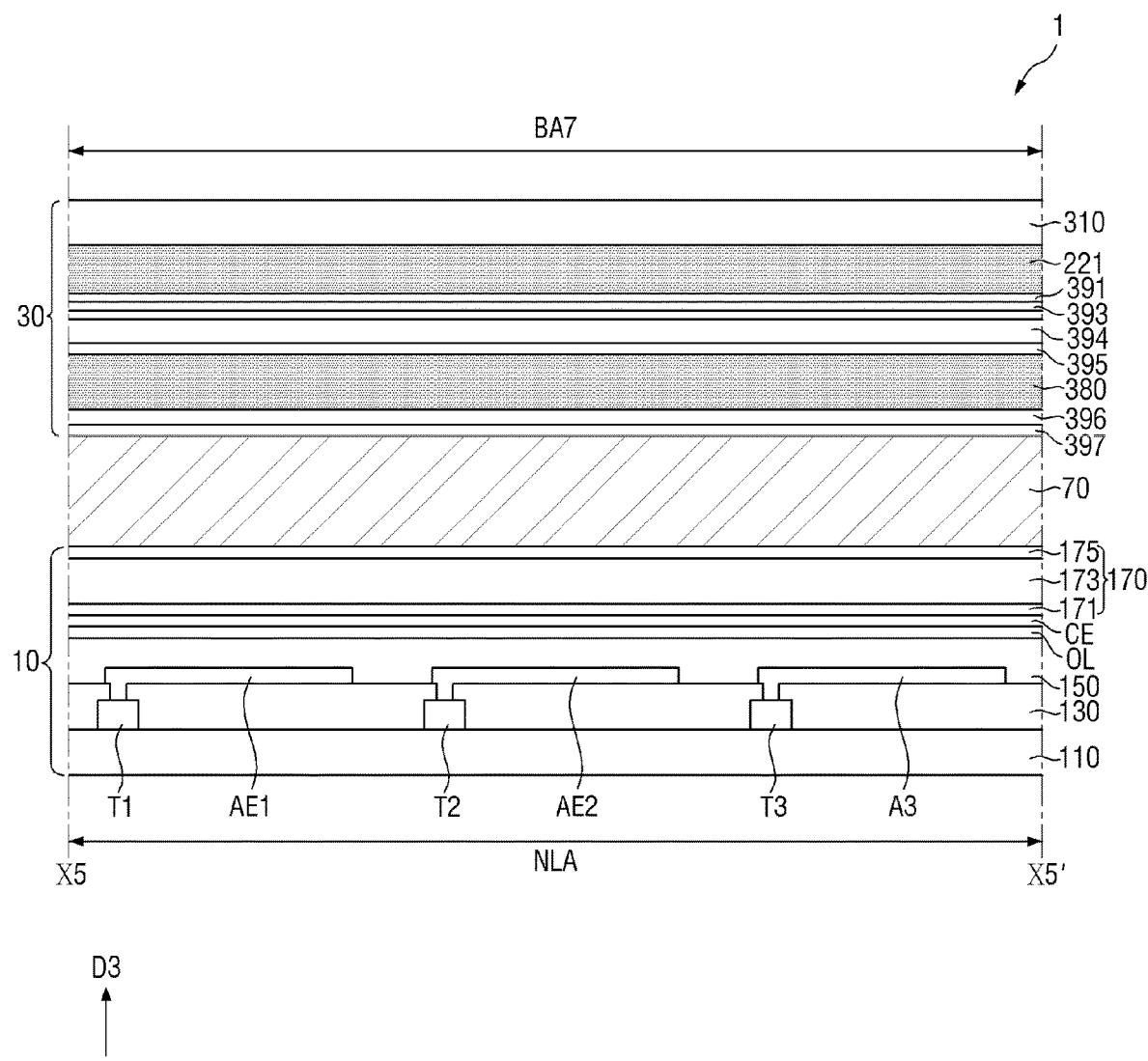
FIG. 10 is a cross-sectional view of the display device according to the embodiment, taken along X5-X5' of FIGS. 3 and 4.

FIG. 5 is a cross-sectional view of the display device 1 according to the embodiment, taken along X1-X1' of FIGS. 3 and 4. FIG. 6 is an enlarged cross-sectional view of portion Q of FIG. 5. FIG. 7 is a cross-sectional view of the display device 1 according to the embodiment, taken along X2-X2' of FIGS. 3 and 4. FIG. 8 is a cross-sectional view of the display device 1 according to the embodiment, taken along X3-X3' of FIGS. 3 and 4. FIG. 9 is a cross-sectional view of the display device 1 according to the embodiment, taken along X4-X4' of FIGS. 3 and 4. FIG. 10 is a cross-sectional view of the display device 1 according to the embodiment, taken along X5-X5' of FIGS. 3 and 4.

Referring to FIGS. 5 through 10 in addition to FIGS. 3 and 4, the display device 1 may include the first substrate 10 and the second substrate 30 as described above and may further include the filler 70 located between the first substrate 10 and the second substrate 30.

A first base 110 may be made of a light transmitting material. In some embodiments, the first base 110 may be a glass substrate or a plastic substrate. When the first base 110 is a plastic substrate, it may have flexibility. In some embodiments, the first base 110 may further include a separate layer located on the glass substrate or the plastic substrate, for example, a buffer layer or an insulating layer.

In some embodiments, the light emitting regions LA1 through LA6 and the non-light emitting region NLA may be defined in the first base 110 as described above.

As illustrated in FIGS. 5, 7, 8 and 9, a first switching element T1, a second switching element T2, a third switching element T3, a fourth switching element T4, a fifth switching element T5 and a sixth switching element T6 may be located on the first base 110. In some embodiments, the first switching element T1, the second switching element T2, the third switching element T3, the fourth switching element T4, the fifth switching element T5, and the sixth switching element T6 may all be disposed in the non-light emitting region NLA. In some embodiments, the first switching element T1 may be located in the first light emitting region LA1, the second switching element T2 may be located in the second light emitting region LA2, the third switching element T3 may be located in the third light emitting region LA3, the fourth switching element T4 may be located in the fourth light emitting region LA4, the fifth switching element T5 may be located in the fifth light emitting region LA5, and the sixth switching element T6 may be located in the sixth light emitting region LA6.

In some embodiments, each of the switching elements T1 through T6 may be a thin-film transistor including polysilicon or a thin-film transistor including an oxide semiconductor.

Although not illustrated in the drawings, a plurality of signal lines (e.g., a gate line, a data line, a power supply line, etc.) for transmitting signals to each of the switching elements T1 through T6 may be on the first base 110.

An insulating film 130 may be located on the switching elements T1 through T6. In some embodiments, the insulating film 130 may be a planarization film. In some embodiments, the insulating film 130 may be made of an organic film. The insulating film 130 may include, for example, acrylic resin, epoxy resin, imide resin, or ester resin. In some embodiments, the insulating film 130 may include a positive photosensitive material or a negative photosensitive material.

A first anode AE1, a second anode AE2, a third anode AE3, a fourth anode AE4, a fifth anode AE5, and a sixth anode AE6 may be located on the insulating film 130. The first anode AE1 may be located (at least partially) in the first light emitting region LA1, but at least a portion of the first anode AE1 may extend to the non-light emitting region NLA. The second anode AE2 may be located (at least partially) in the second light emitting region LA2, but at least a portion of the second anode AE2 may extend to the non-light emitting region NLA. The third anode AE3 may be located (at least partially) in the third light emitting region LA3, but at least a portion of the third anode AE3 may extend to the non-light emitting region NLA. The fourth anode AE4 may be located (at least partially) in the fourth light emitting region LA4, but at least a portion of the fourth anode AE4 may extend to the non-light emitting region NLA. The fifth anode AE5 may be located (at least partially) in the fifth light emitting region LA5, but at least a portion of the fifth anode AE5 may extend to the non-light emitting region NLA. The sixth anode AE6 may be located (at least partially) in the sixth light emitting region LA6, but at least a portion of the sixth anode AE6 may extend to the non-light emitting region NLA. The first anode AE1 may pass through the insulating film 130 and be connected to the first switching element T1, the second anode AE2 may pass through the insulating film 130 and be connected to the second switching element T2, the third anode AE3 may pass through the insulating film 130 and be connected to the third switching element T3, the fourth anode AE4 may pass through the insulating film 130 and be connected to the fourth switching element T4, the fifth anode AE5 may pass through the insulating film 130 and be connected to the fifth switching element T5, and the sixth anode AE6 may pass through the insulating film 130 and be connected to the sixth switching element T6.

In some embodiments, the first anode AE1, the second anode AE2 and the third anode AE3 may be different from each other in width and/or area. For example, a width of the first anode AE1 may be smaller than a width of the second anode AE2, and a width of the third anode AE3 may be smaller than the width of the second anode AE2, but may be greater than the width of the first anode AE1. Alternatively, in some embodiments, the area of the first anode AE1 may be smaller than the area of the second anode AE2, and the area of the third anode AE3 may be smaller than the area of the second anode AE2, but may be larger than the area of the first anode AE1. A width and/or area of the fourth anode AE4 may be the same or substantially the same as that of the first anode AE1, a width and/or area of the fifth anode AE5 may be the same or substantially the same as that of the second anode AE2, and a width and/or area of the sixth anode AE6 may be the same or substantially the same as that of the third anode AE3.

The anodes AE1 through AE6 may be reflective electrodes. In such an embodiment, each of the anodes AE1 through AE6 may be a metal layer including a metal such as Ag, Mg, Al, Pt, Pd, Au, Ni, Nd, Ir or Cr. In an embodiment, each of the anodes AE1 through AE6 may further include a metal oxide layer stacked on the metal layer. In an exemplary embodiment, each of the anodes AE1 through AE6 may have a two-layer structure of ITO/Ag, Ag/ITO, ITO/Mg or ITO/MgF or a multilayer structure of ITO/Ag/ITO.

A pixel defining layer 150 may be located on the anodes AE1 through AE6. The pixel defining layer 150 may include openings respectively exposing the anodes AE1 through AE6 and may define the first light emitting region LA1, the second light emitting region LA2, the third light emitting region LA3, the fourth light emitting region LA4, the fifth light emitting region LA5, the sixth light emitting region LA6, and the non-light emitting region NLA. That is, a region of the first anode AE1 which is not covered by the pixel defining layer 150 may be the first light emitting region LA1. Similarly, a region of the second anode AE2 which is not covered by the pixel defining layer 150 may be the second light emitting region LA2, and a region of the third anode AE3 which is not covered by the pixel defining layer 150 may be the third light emitting region LA3. In addition, a region where the pixel defining layer 150 is located may be the non-light emitting region NLA. The fourth light emitting region LA4, the fifth light emitting region LA5, and the sixth light emitting regions LA6 may also be respectively defined as regions of the fourth anode AE4, the fifth anode AE5, and the sixth anode AE6 which are not covered by the pixel defining layer 150.

In some embodiments, the pixel defining layer 150 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

In some embodiments, the pixel defining layer 150 may overlap (at least in part) a light shielding pattern 221 to be described later. In addition, the pixel defining layer 150 may overlap (at least in part) a color mixing preventing member 370 and a light shielding member 380 to be described later.

A light emitting layer OL may be located on the anodes AE1 through AE6 and the pixel defining layer 150.

In some embodiments, the light emitting layer OL may be a continuous layer formed over the light emitting regions LA1 through LA6 and the non-light emitting region NLA. The light emitting layer OL will be described in more detail later.

A cathode CE may be located on the light emitting layer OL.

In some embodiments, the cathode CE may have translucency or transparency. When the cathode CE has translucency, it may include Ag, Mg, Cu, Al, Pt, Pd, Au, Ni, Nd, Ir, Cr, Li, Ca, LiF/Ca, LiF/Al, Mo, Ti, or a compound or mixture of the same (e.g., a mixture of Ag and Mg). In addition, when a thickness of the cathode CE is tens to hundreds of angstroms, the cathode CE may have translucency.

When the cathode CE has transparency, it may include transparent conductive oxide (TCO). For example, the cathode CE may include tungsten oxide (WxOx), titanium oxide (TiO$_2$), indium tin oxide (ITO), indium zinc oxide (IZO), zinc oxide (ZnO), indium tin zinc oxide (ITZO), or magnesium oxide (MgO).

The first anode AE1, the light emitting layer OL, and the cathode CE may constitute a first light emitting element ED1; the second anode AE2, the light emitting layer OL, and the cathode CE may constitute a second light emitting element ED2; and the third anode AE3, the light emitting layer OL, and the cathode CE may constitute a third light emitting element ED3. Similarly, the fourth anode AE4, the light emitting layer OL, and the cathode CE may constitute a fourth light emitting element ED4; the fifth anode AE5, the light emitting layer OL, and the cathode CE may constitute a fifth light emitting element ED5; and the sixth anode AE6, the light emitting layer OL, and the cathode CE may constitute a sixth light emitting element ED6. Each of the first light emitting element ED1, the second light emitting element ED2, the third light emitting element ED3, the fourth light emitting element ED4, the fifth light emitting element ED5 and the sixth light emitting element ED6 may emit output light L1, and the output light L1 may be provided to the second substrate 30. The color of the output light L1 emitted from each light emitting element may be the same. For example, the output light L1 may be blue light.

In some embodiments, the light emitting layer OL may have a tandem structure. For example, referring to FIG. 6, the light emitting layer OL may include a first stack ST1 including a first light emitting layer EML1, a second stack ST2 located on the first stack ST1 and including a second light emitting layer EML2, a third stack ST3 located on the second stack ST2 and including a third light emitting layer EML3, a first charge generation layer CGL1 located between the first stack ST1 and the second stack ST2, and a second charge generation layer CGL2 located between the second stack ST2 and the third stack ST3. The first stack ST1, the second stack ST2, and the third stack ST3 may overlap each other at least in part.

The first light emitting layer EML1, the second light emitting layer EML2, and the third light emitting layer EML3 may be disposed to overlap each other at least in part.

In some embodiments, light emitted from each of the first light emitting layer EML1, the second light emitting layer EML2, and the third light emitting layer EML3 may have a peak wavelength of less than about (approximately) 610 nm. Each of the first light emitting layer EML1, the second light emitting layer EML2, and the third light emitting layer EML3 may not emit light having a peak wavelength in a range from about (approximately) 610 nm to about (approximately) 680 nm, for example, red light.

In some embodiments, the first light emitting layer EML1, the second light emitting layer EML2 and the third light emitting layer EML3 may all emit light of the first color, for example, blue light. For example, each of the first light emitting layer EML1, the second light emitting layer EML2, and the third light emitting layer EML3 may be a blue light emitting layer and may include an organic material.

In some embodiments, each of the first light emitting layer EML1, the second light emitting layer EML2, and the third light emitting layer EML3 may include a host and a dopant. The host is not particularly limited as long as it is a commonly used material. For example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (AND), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), or 2-methyl-9,10-bis(naphthalen-2-yl)anthracene) (MADN) may be utilized as the host.

Each of the first light emitting layer EML1, the second light emitting layer EML2, and the third light emitting layer EML3, which emit blue light, may include a fluorescent material containing any one of spiro-DPVBi, spiro-6P, distyryl-benzene (DSB), distyryl-arylene (DSA), a polyfluorene (PFO)-based polymer, and a poly (p-phenylene vinylene) (PPV)-based polymer. Alternatively, a phosphorescent material containing an organometallic complex such as (4,6-F2ppy)2Irpic may be utilized.

According to the above-described embodiments, it is possible to increase light efficiency and realize a long life as compared with a related art light emitting element that does not have a tandem structure, that is, does not employ a structure in which a plurality of light emitting layers are stacked.

The first charge generation layer CGL1 may be located between the first stack ST1 and the second stack ST2. The first charge generation layer CGL1 may inject electric charges into each light emitting layer. The first charge generation layer CGL1 may control the charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be located between the n-type charge generation layer CGL11 and the second stack ST2.

The first charge generation layer CGL1 may have a structure in which the n-type charge generation layer CGL11 and the p-type charge generation layer CGL 12 are bonded to each other. The n-type charge generation layer CGL11 is configured to supply electrons to the first light emitting layer EML1, and the p-type charge generation layer CGL12 is configured to supply holes to the second light emitting layer EML2 included in the second stack ST2. Since the first charge generation layer CGL1, which is between the first stack ST1 and the second stack ST2, is configured to provide electric charges to each light emitting layer, luminous efficiency can be improved, and a driving voltage can be lowered compared to related art displays.

The first stack ST1 may further include a first hole transport layer HTL1, a first electron blocking layer BIL1, and a first electron transport layer ETL1.

The first hole transport layer HTL1 may facilitate the transportation of holes and may include a hole transport material. The hole transport material may include, but is not limited to, a carbazole derivative such as N-phenylcarbazole or polyvinylcarbazole; a fluorene derivative; a triphenylamine derivative such as N,N'-bis(3-methylphenyl)-N,N'-diphenyl-[1,1-biphenyl]-4,4'-diamine (TPD) or 4,4',4''-tris(N-carbazolyl)triphenylamine (TCTA); N,N'-di(1-naphthyl)-N,N'-diphenylbenzidine) (NPB); or 4,4'-Cyclohexylidene bis [N,N-bis(4-methylphenyl)benzenamine] (TAPC).

The first electron blocking layer BIL1 may be located on the first hole transport layer HTL1 and may be located between the first hole transport layer HTL1 and the first light emitting layer EML1. The first electron blocking layer BIL1 may include a hole transport material and a metal or a metal compound in order to prevent or at least mitigate against electrons generated by the first light emitting layer EML1 from entering the first hole transport layer HTL1. In some embodiments, the first hole transport layer HTL1 and the first electron blocking layer BIL1 may be formed as a single layer in which their respective materials are mixed.

The first electron transport layer ETL1 may be located on the first light emitting layer EML1 and may be located between the first charge generation layer CGL1 and the first light emitting layer EML1. In some embodiments, the first electron transport layer ETL1 may include an electron transport material such as tris-(8-hydroxyquinolinato)aluminum (Alq3), 1,3,5-tri(1-phenyl-1H-benzo[d]imidazol-2-yl) phenyl (TPBi), 2,9-dimethyl-4,7-diphenyl-1,10-phenanthroline (BCP), 4,7-diphenyl-1,10-phenanthroline (Bphen), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphalene-2-yl) anthracene (ADN), or a mixture of these materials. However, embodiments are not limited to any particular type of the electron transport material.

The second stack ST2 may be located on the first charge generation layer CGL1 and may further include a second hole transport layer HTL2, a second electron blocking layer BIL2, and a second electron transport layer ETL2.

The second hole transport layer HTL2 may be located on the first charge generation layer CGL1. The second hole transport layer HTL2 may be made of the same material as the first hole transport layer HTL1 or may include one or more materials selected from the materials exemplified as the material included in the first hole transport layer HTL1.

The second electron blocking layer BIL2 may be located on the second hole transport layer HTL2 and may be located between the second hole transport layer HTL2 and the second light emitting layer EML2. The second electron blocking layer BIL2 may have the same material and structure as the first electron blocking layer BIL1 or may include one or more materials selected from the materials exemplified as the material included in the first electron blocking layer BIL1.

The second electron transport layer ETL2 may be located on the second light emitting layer EML2 and may be located between the second charge generation layer CGL2 and the second light emitting layer EML2. The second electron transport layer ETL2 may have the same material and structure as the first electron transport layer ETL1 or may include one or more materials selected from the materials exemplified as the material included in the first electron transport layer ETL1.

The second charge generation layer CGL2 may be located on the second stack ST2 and may be located between the second stack ST2 and the third stack ST3.

The second charge generation layer CGL2 may have the same structure as the first charge generation layer CGL1 described above. For example, the second charge generation layer CGL2 may include an n-type charge generation layer CGL21 closer (e.g., proximate) to the second stack ST2 and a p-type charge generation layer CGL22 closer (e.g., proximate) to the cathode CE. The p-type charge generation layer CGL2 may be on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may be made of different materials or the same material.

The third stack ST3 may be located on the second charge generation layer CGL2 and may further include a third hole transport layer HTL3 and a third electron transport layer ETL3.

The third hole transport layer HTL3 may be located on the second charge generation layer CGL2. The third hole transport layer HTL3 may be made of the same material as the first hole transport layer HTL1 or may include one or more materials selected from the materials exemplified as the material included in the first hole transport layer HTL1.

The third electron transport layer ETL3 may be located on the third light emitting layer EML3 and may be located between the cathode CE and the third light emitting layer EML3. The third electron transport layer ETL3 may have the same material and structure as the first electron transport layer ETL1 or may include one or more materials selected from the materials exemplified as the material included in the first electron transport layer ETL1.

As illustrated in FIGS. 5 and 7 through 10, a thin-film encapsulation layer 170 is on the cathode CE. The thin-film encapsulation layer 170 is common to the light emitting regions LA1 through LA6 and the non-light emitting region NLA. In some embodiments, the thin-film encapsulation layer 170 directly covers the cathode CE. In some embodiments, a capping layer (not illustrated) covering the cathode CE may be between the thin-film encapsulation layer 170 and the cathode CE. In such an embodiment, the thin-film encapsulation layer 170 may directly cover the capping layer.

In some embodiments, the thin-film encapsulation layer 170 may include a first encapsulating inorganic layer 171, an encapsulating organic layer 173, and a second encapsulating inorganic layer 175 sequentially stacked on the cathode CE.

In some embodiments, each of the first encapsulating inorganic layer 171 and the second encapsulating inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulating organic layer 173 may be made of acrylic resin, methacrylic resin, polyisoprene, vinyl resin, epoxy resin, urethane resin, cellulose resin, or perylene resin.

The stacked structure of the thin-film encapsulation layer 170 is not limited to the above example and can be changed in a variety of ways.

The second substrate 30 will now be described with reference to FIGS. 11 through 16 in addition to FIGS. 5 through 10. In the current embodiment, the second substrate 30 is a color conversion substrate as described above.

Figure 11:
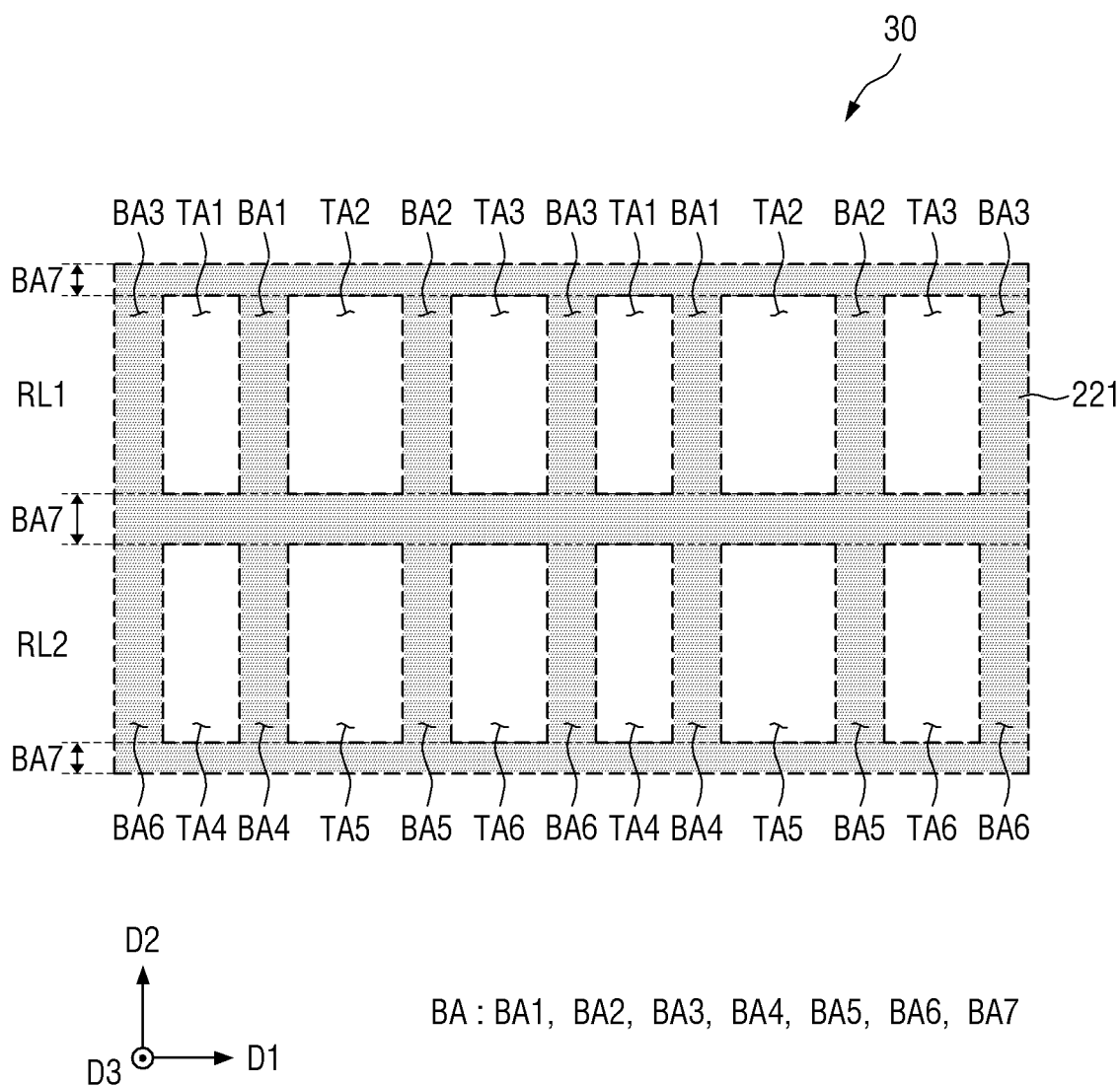
FIG. 11 is a plan view illustrating the schematic arrangement of a light shielding pattern in the second substrate of the display device according to the embodiment.
Figure 12:
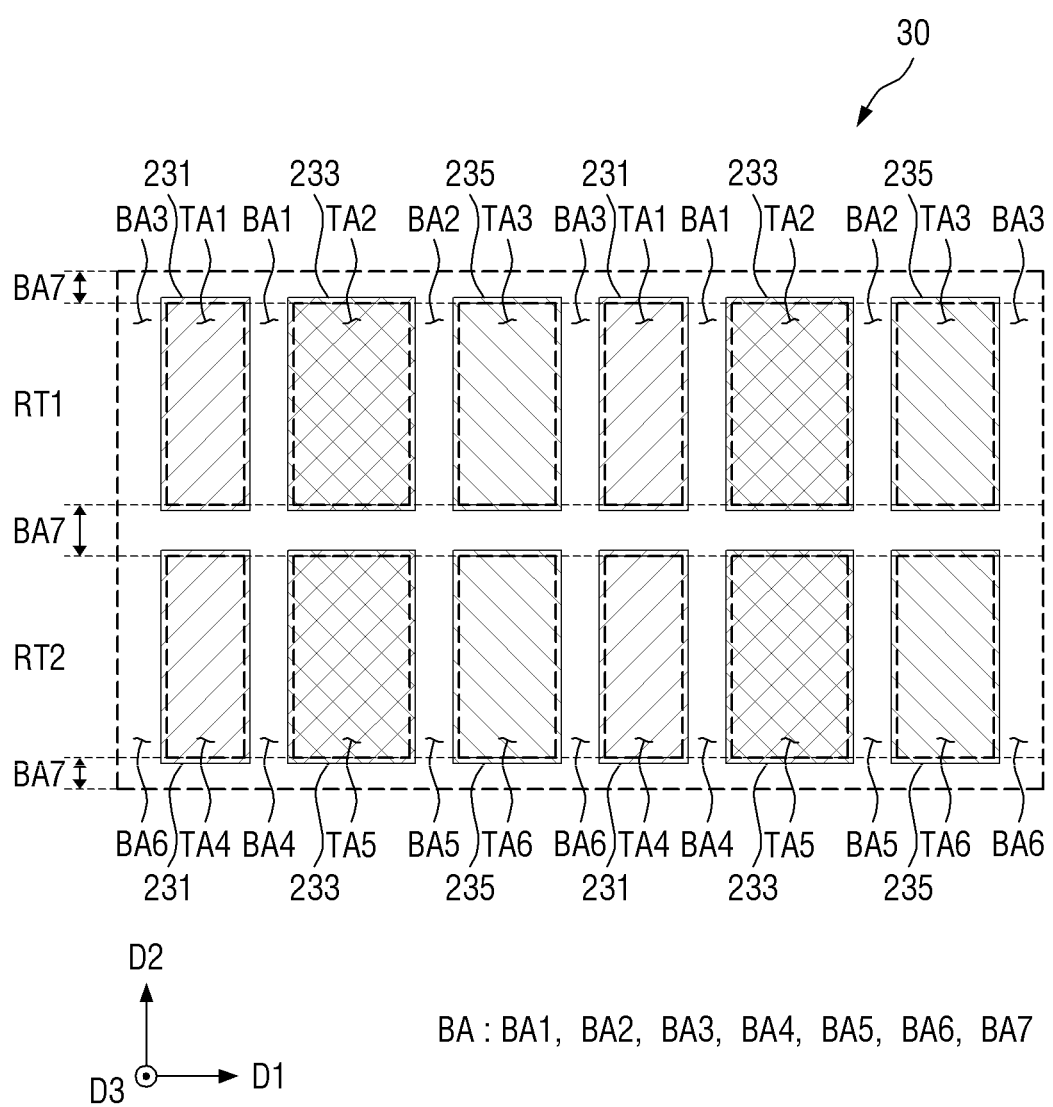
FIG. 12 is a plan view illustrating the schematic arrangement of color filters in the second substrate of the display device according to the embodiment.
Figure 13:
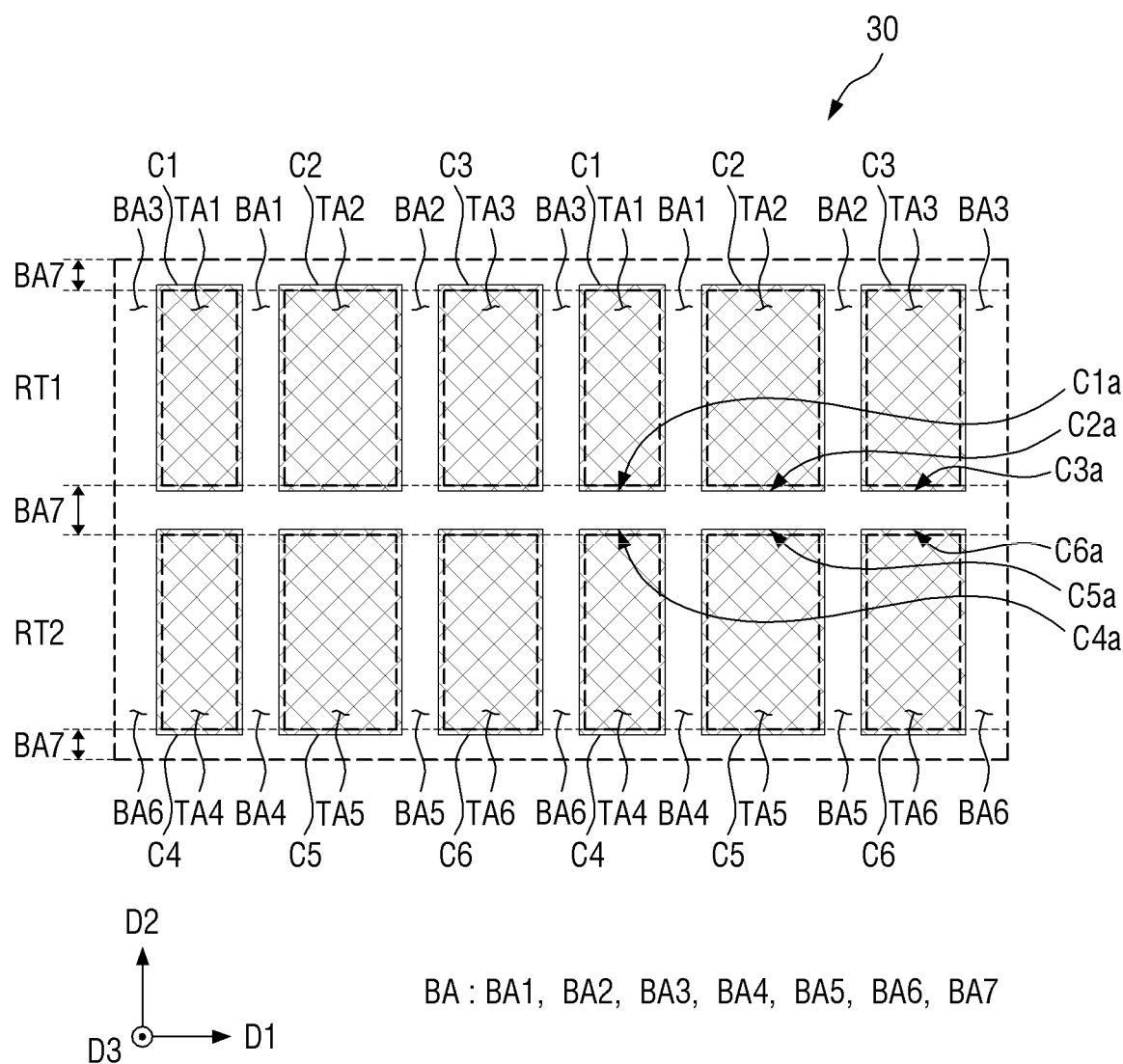
FIG. 13 is a plan view illustrating the schematic arrangement of microcavities in the second substrate of the display device according to the embodiment.
Figure 14:
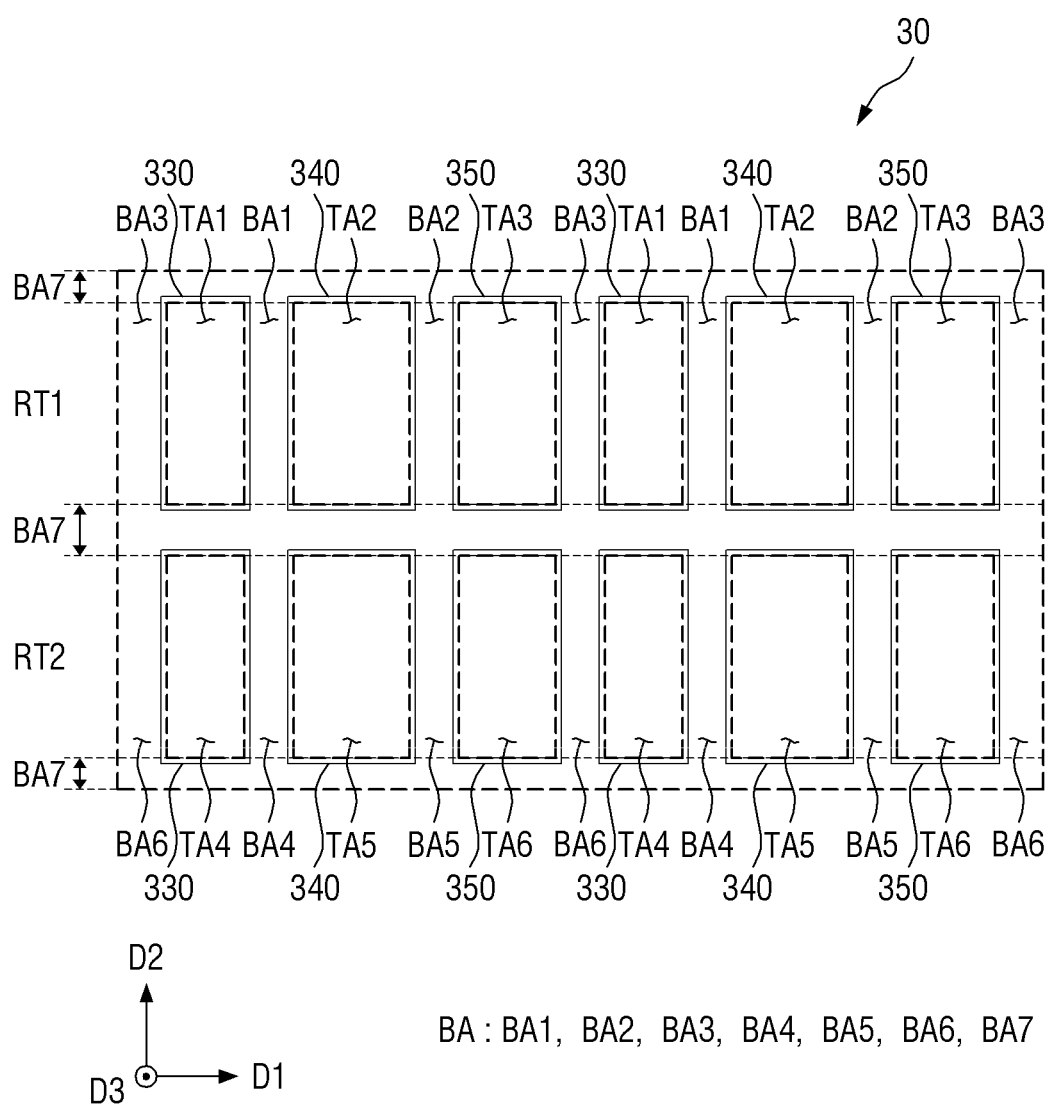
FIG. 14 is a plan view illustrating the schematic arrangement of a first wavelength conversion pattern, a second wavelength conversion pattern and a light transmission pattern in the second substrate of the display device according to the embodiment.
Figure 15:
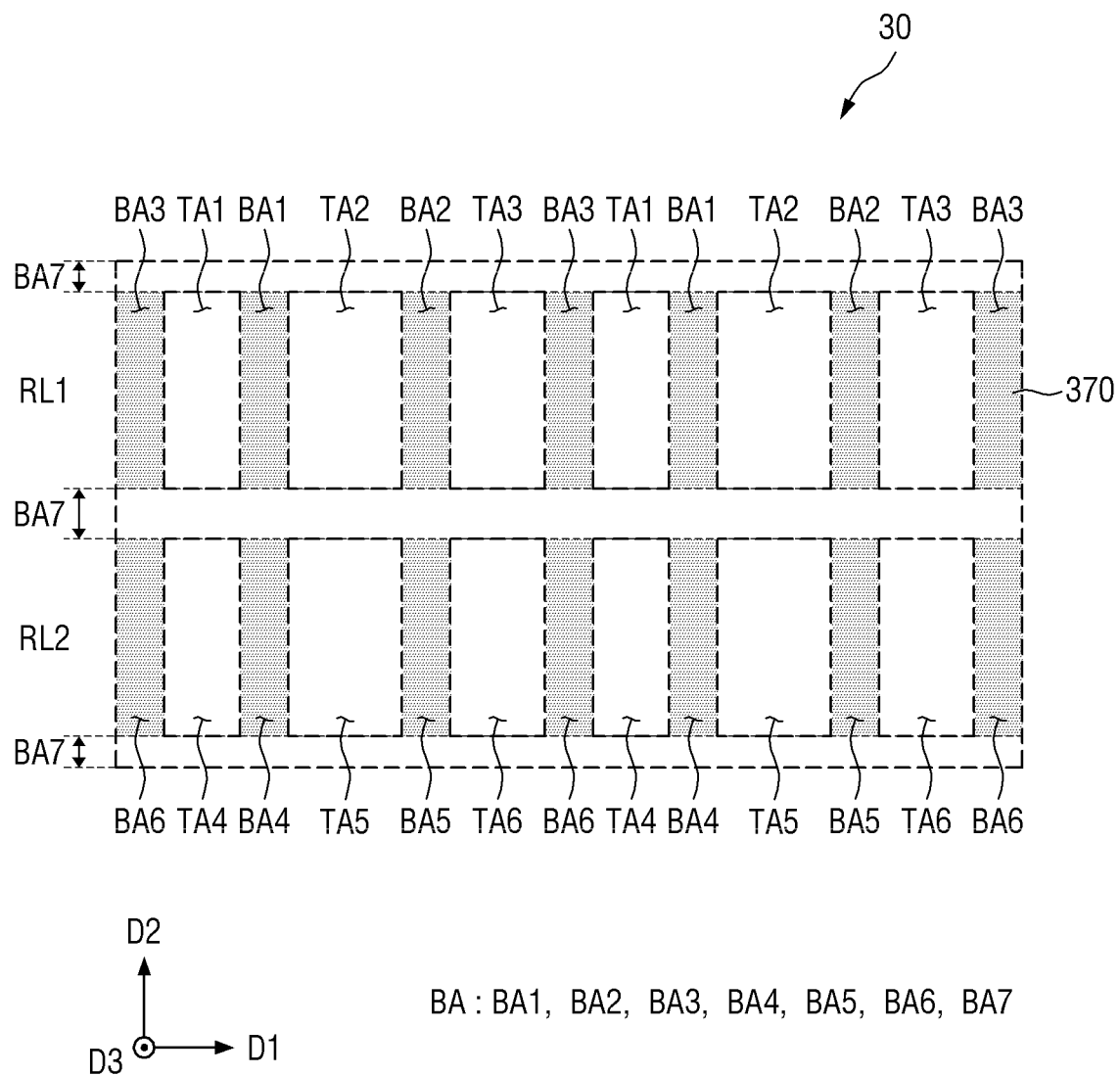
FIG. 15 is a plan view illustrating the schematic arrangement of a color mixing preventing member in the second substrate of the display device according to the embodiment.
Figure 16:
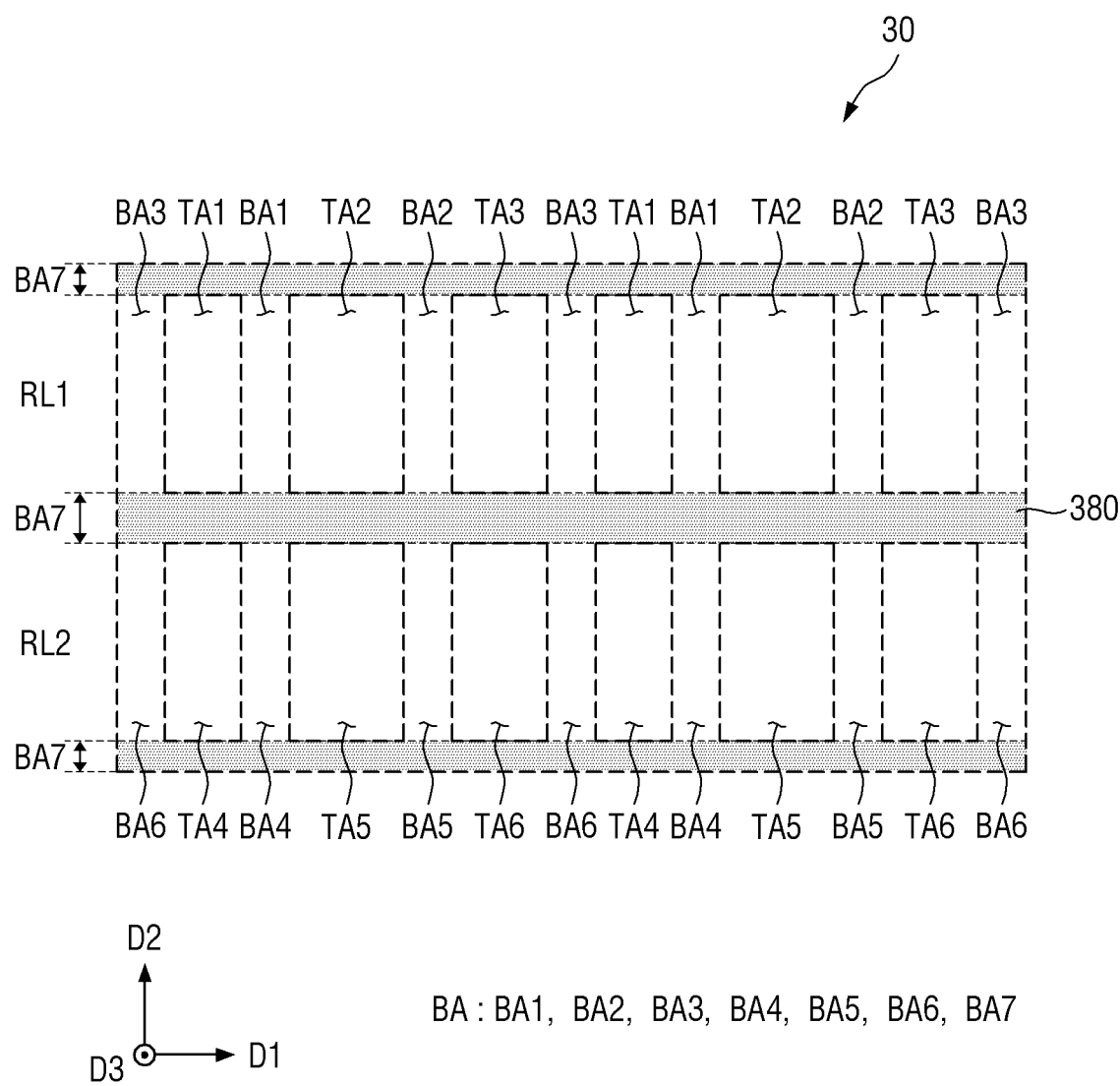
FIG. 16 is a plan view illustrating the schematic arrangement of a light shielding member in the second substrate of the display device according to the embodiment.

FIG. 11 is a plan view illustrating the schematic arrangement of the light shielding pattern 221 in the second substrate 30 of the display device 1 according to one embodiment. FIG. 12 is a plan view illustrating the schematic arrangement of color filters 231, 233 and 235 in the second substrate 30 of the display device 1 according to one embodiment. FIG. 13 is a plan view illustrating the schematic arrangement of microcavities C1 through C6 in the second substrate 30 of the display device 1 according to the embodiment. FIG. 14 is a plan view illustrating the schematic arrangement of a first wavelength conversion pattern 340, a second wavelength conversion pattern 350 and a light transmission pattern 330 in the second substrate 30 of the display device 1 according to one embodiment. FIG. 15 is a plan view illustrating the schematic arrangement of the color mixing prevention member 370 in the second substrate 30 of the display device 1 according to one embodiment. FIG. 16 is a plan view illustrating the schematic arrangement of the light shielding member 380 in the second substrate 30 of the display device 1 according to one embodiment.

Referring to FIGS. 5 through 16, a second base 310 illustrated in FIGS. 5 through 10 may be made of a light transmitting material. In some embodiments, the second base 310 may include a glass substrate or a plastic substrate. In some embodiments, the second base 310 may further include a separate layer located on the glass substrate or the plastic substrate, for example, an insulating layer such as an inorganic layer.

In some embodiments, the light transmitting regions TA1 through TA6 and the light shielding region BA may be defined in the second base 310 as illustrated in FIG. 4.

As illustrated in FIGS. 5 and 7 through 11, the light shielding pattern 221 may be located on a surface of the second base 310 which faces the first substrate 10. The light shielding pattern 221 may be located in the light shielding region BA to block transmission of light. In some embodiments, the light shielding pattern 221 may be disposed in a substantially lattice form in plan view as illustrated in FIG. 11.

In some embodiments, the light shielding pattern 221 may include an organic light shielding material and may be formed by coating and exposing the organic light emitting material.

As illustrated in FIGS. 5 and 7 through 12, a first color filter 231, a second color filter 233, and a third color filter 235 may be located on the surface of the second base 310 which faces the first substrate 10.

The first color filter 231 may be located in the first light transmitting region TA1 and the fourth light transmitting region TA4. In some embodiments, the first color filter 231 located in the first light transmitting region TA1 and the first color filter 231 located in the fourth light transmitting region TA4 may be spaced apart from each other along the second direction D2.

The first color filter 231 may transmit only light of the first color (e.g., blue light) and block or absorb light of the second color (e.g., red light) and light of the third color (e.g., green light). In some embodiments, the first color filter 231 may be a blue color filter and may include a blue colorant such as a blue dye or a blue pigment.

The second color filter 233 may be located in the second light transmitting region TA2 and the fifth light transmitting region TA5. The third color filter 235 may be located in the third light transmitting region TA3 and the sixth light transmitting region TA6.

In some embodiments, the second color filter 233 may block or absorb light of the first color (e.g., blue light). That is, the second color filter 233 may function as a blue light blocking filter that blocks blue light. In some embodiments, the second color filter 233 may transmit only light of the second color (e.g., red light) and block or absorb light of the first color (e.g., blue light) and light of the third color (e.g., green light). For example, the second color filter 233 may be a red color filter and may include a red colorant.

The third color filter 235 may block or absorb light of the first color (e.g., blue light). That is, the third color filter 235 may also function as a blue light blocking filter that blocks blue light. In some embodiments, the third color filter 235 may transmit only light of the third color (e.g., green light) and block or absorb light of the first color (e.g., blue light) and light of the second color (e.g., red light). For example, the third color filter 235 may be a green color filter and may include a green colorant.

In some embodiments, at least a portion of each of a side and the other side of the first color filter 231, at least a portion of each of a side and the other side of the second color filter 233 and at least a portion of each of a side and the other side of the third color filter 235 may be located in the light shielding region BA and may overlap the light shielding pattern 221.

As illustrated in FIGS. 5 and 7 through 10, a first capping layer 391 may be located on (e.g., indirectly on) the surface of the second base 310 to cover the light shielding pattern 221, the first color filter 231, the second color filter 233 and the third color filter 235. In some embodiments, the first capping layer 391 may directly contact the first color filter 231, the second color filter 233, and the third color filter 235. In some embodiments, the first capping layer 391 may further contact the light shielding pattern 221.

The first capping layer 391 may prevent impurities such as moisture or air from being introduced from the outside and damaging or contaminating the light shielding pattern 221, the first color filter 231, the second color filter 233, and the third color filter 235. In addition, the first capping layer 391 may prevent the colorants contained in the first color filter 231, the second color filter 233, and the third color filter 235 from being diffused to other elements such as the first wavelength conversion pattern 340 and the second wavelength conversion pattern 350. In some embodiments, the first capping layer 391 may be made of an inorganic material. For example, the first capping layer 391 may be made of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

As illustrated in FIGS. 5, 7 through 10 and 13, microcavities may be located on the first capping layer 391. For example, a first microcavity C1, a second microcavity C2, a third microcavity C3, a fourth microcavity C4, a fifth microcavity C5, and a sixth microcavity C6 may be located on the first capping layer 391.

The first microcavity C1 may be located in the first light transmitting region TA1. In some embodiments, a side C1a of the first microcavity C1 may be located in the seventh light shielding region BA7 facing a side C4a of the fourth microcavity C4 and may be open. In one embodiment, when the side C1a of the first microcavity C1 is open, it may mean that the side C1a of the first microcavity C1 is not covered by a second capping layer 393 which will be described later.

The second microcavity C2 may be located in the second light transmitting region TA2. In some embodiments, a side C2a of the second microcavity C2 may be located in the seventh light shielding region BA7 facing a side C5a of the fifth microcavity C5 and may be open.

The third mcirocavity C3 may be located in the third light transmitting region TA3. In some embodiments, a side C3a of the third microcavity C3 may be located in the seventh light shielding region BA7 facing a side C6a of the sixth microcavity C6 and may be open.

The fourth microcavity C4 may be located in the fourth light transmitting region TA4. In some embodiments, the side C4a of the fourth microcavity C4 may be located in the seventh light shielding region BA7 facing the side C1a of the first microcavity C1 and may be open.

The fifth microcavity C5 may be located in the fifth light transmitting region TA5. In some embodiments, the side C5a of the fifth microcavity C5 may be located in the seventh light shielding region BA7 facing the side C2a of the second microcavity C2 and may be open.

The sixth microcavity C6 may be located in the sixth light transmitting region TA6. In some embodiments, the side C6a of the sixth microcavity C6 may be located in the seventh light shielding region BA7 facing the side C3a of the third microcavity C3 and may be open.

The open side of each microcavity C1 to C6 may function as an inlet through which a material is injected into the microcavity in a process of manufacturing the second substrate 30.

The first microcavity C1, the second microcavity C2, the third microcavity C3, the fourth microcavity C4, the fifth microcavity C5, and the sixth microcavity C6 may be defined between the first capping layer 391 and the second capping layer 393 to be described later.

As illustrated in FIGS. 5, 7 through 10 and 14, the light transmitting pattern 330, the first wavelength conversion pattern 340, and the second wavelength conversion pattern 350 may be located on the first capping layer 391.

In some embodiments, the light transmission pattern 330, the first wavelength conversion pattern 340, and the second wavelength conversion pattern 350 may be formed using an inkjet method.

The light transmission pattern 330 may be located on (e.g., directly on) the first capping layer 391 and may be located in the first light transmitting region TA1 and the fourth light transmitting region TA4. The light transmission pattern 330 may overlap (at least in part) the first color filter 231. In some embodiments, the light transmission pattern 330 may be located in the first microcavity C1 and the fourth microcavity C4 and may fill or substantially fill the first microcavity C1 and the fourth microcavity C4.

The light transmission pattern 330 may transmit incident light. The output light L1 provided by the first light emitting element ED1 may be blue light as described above. The output light L1, which is blue light, is emitted out of the display device 1 through the light transmission pattern 330 and the first color filter 231. That is, light output from the first light transmitting region TA1 may be blue light.

In some embodiments, the light transmission pattern 330 may include a first base resin 331 and may further include a first scatterer 333 dispersed in the first base resin 331.

The first base resin 331 may be made of a material having high light transmittance. In some embodiments, the first base resin 331 may be made of an organic material. For example, the first base resin 331 may include an organic material such as epoxy resin, acrylic resin, cardo resin, or imide resin.

The first scatterer 333 may have a refractive index different from that of the first base resin 331 and may form an optical interface with the first base resin 331. For example, the first scatterer 333 may be light scattering particles. The first scatterer 333 may be any material that can scatter at least a portion of the transmitted light. For example, the first scatterer 333 may be metal oxide particles or organic particles. Examples of the metal oxide include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the organic particle material include acrylic resin and urethane resin. The first scatterer 333 may scatter incident light in random directions regardless of the incident direction of the light without substantially changing the wavelength of the light transmitted through the light transmission pattern 330.

The first wavelength conversion pattern 340 may be located on (e.g., directly on) the first capping layer 391 and may be located in the second light transmitting region TA2 and the fifth light transmitting region TA. The first wavelength conversion pattern 340 may overlap (at least partially) the second color filter 233. In some embodiments, the first wavelength conversion pattern 340 may be located in the second microcavity C2 and the fifth mcirocavity C5 and may fill or substantially fill the second microcavity C2 and the fifth microcavity C5.

The first wavelength conversion pattern 340 may convert or shift a peak wavelength of incident light into another specific peak wavelength and output light having the converted or shifted specific peak wavelength. In some embodiments, the first wavelength conversion pattern 340 may convert blue light, which is the output light L1 provided by the second light emitting element ED2, into red light having a peak wavelength in the range of about 610 nm to about 650 nm and output the red light.

In some embodiments, the first wavelength conversion pattern 340 may include a second base resin 341 and a first wavelength shifter 345 dispersed in the second base resin 341. The first wavelength conversion pattern 340 may further include a second scatterer 343 dispersed in the second base resin 341.

The second base resin 341 may be made of a material having high light transmittance. In some embodiments, the second base resin 341 may be made of an organic material. In some embodiments, the second base resin 341 may be made of the same material as the first base resin 331 or may include at least one of the materials exemplified as the constituent material of the first base resin 331.

The first wavelength shifter 345 may convert or shift a peak wavelength of incident light to another specific peak wavelength. In some embodiments, the first wavelength shifter 345 may convert the light L1 of the first color, which is blue light provided by the second light emitting element ED2, into red light having a single peak wavelength in the range of about 610 nm to about 650 nm and output the red light.

Examples of the first wavelength shifter 345 may include quantum dots, quantum rods, and phosphors. For example, the quantum dots may be particulate materials that emit light of a specific color when electrons transition or move from a conduction band to a valence band.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include group IV nanocrystals, group II-VI compound nanocrystals, group III-V compound nanocrystals, group IV-VI nanocrystals, and combinations of the same.

The group II-VI compounds may be binary compounds selected from CdSe, CdTe, ZnS, ZnSe, ZnTe, ZnO, HgS, HgSe, HgTe, MgSe, MgS and mixtures of the same; ternary compounds selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures of the same; and/or quaternary compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures of the same.

The group III-V compounds may be binary compounds selected from GaN, GaP, GaAs, GaSb, AlN, AlP, AlAs, AlSb, InN, InP, InAs, InSb, and mixtures of the same; ternary compounds selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures of the same; and/or quaternary compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures of the same.

The group IV-VI compounds may be binary compounds selected from SnS, SnSe, SnTe, PbS, PbSe, PbTe, and mixtures of the same; ternary compounds selected from SnSeS, SnSeTe, SnSTe, PbSeS, PbSeTe, PbSTe, SnPbS, SnPbSe, SnPbTe, and mixtures of the same; and/or quaternary compounds selected from SnPbSSe, SnPbSeTe, SnPbSTe, and mixtures of the same. The group IV elements may be selected from silicon (Si), germanium (Ge), and a mixture of the same. The group IV compounds may be binary compounds selected from silicon carbide (SiC), silicon germanium (SiGe), and a mixture of the same.

In one embodiment, the binary, ternary, and/or quaternary compounds may be present in the particles at a uniform concentration or may be present in the same particles at partially different concentrations. In addition, they may have a core/shell structure in which one quantum dot surrounds another quantum dot. An interface between the core and the shell may have a concentration gradient in which the concentration of an element present in the shell decreases toward the center.

In some embodiments, the quantum dots may have a core-shell structure including a core containing the above-described nanocrystal and a shell surrounding the core. The shell of each quantum dot may serve as a protective layer for maintaining semiconductor characteristics by preventing or at least mitigating against chemical denaturation of the core and/or as a charging layer for giving electrophoretic characteristics to the quantum dot. The shell may be a single layer or a multilayer. An interface between the core and the shell may have a concentration gradient in which the concentration of an element present in the shell decreases toward the center. The shell of each quantum dot may be, for example, a metal or non-metal oxide, a semiconductor compound, or a combination of the same.

For example, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$.

In addition, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

Light emitted from the first wavelength shifter 345 may have a full width of half maximum (FWHM) of an emission wavelength spectrum of about 45 nm or less, about 40 nm or less, or about 30 nm or less. Therefore, the color purity and color gamut of the display device 1 can be improved compared to related art display devices without the first wavelength shifter 345. In addition, the light emitted from the first wavelength shifter 345 may be radiated in various directions regardless of the incident direction of incident light. Therefore, the lateral visibility of the second color displayed in the second light transmitting region TA2 can be improved compared to related art display devices without the first wavelength shifter 345.

A portion of the output light L1, which is blue light provided by the second light emitting element ED2, may be transmitted through the first wavelength conversion pattern 340 without being converted into red light by the first wavelength shifter 345. Of the output light L1, a component incident on the second color filter 233 without being converted by the first wavelength conversion pattern 340 may be blocked by the second color filter 233. On the other hand, red light into which a portion of the output light L1 has been converted by the first wavelength conversion pattern 340 (e.g., the first wavelength shifter 345) may be transmitted through the second color filter 233 and emitted to the outside. Thus, light output from the second light transmitting region TA2 may be red light.

The second scatterer 343 may have a refractive index different from that of the second base resin 341 and may form an optical interface with the second base resin 341. For example, the second scatterer 343 may be light scattering particles. Other details of the second scatterer 343 are substantially the same or similar to those of the first scatterer 333, and thus a detailed description thereof is omitted.

The second wavelength conversion pattern 350 may be located on (e.g., directly on) the first capping layer 391 and may be located in the third light transmitting region TA3 and the sixth light transmitting region TA6. The second wavelength conversion pattern 350 may overlap (at least partially) the third color filter 235. In some embodiments, the second wavelength conversion pattern 350 may be located in the third microcavity C3 and the sixth microcavity C6 and may fill or substantially fill the third microcavity C3 and the sixth microcavity C6.

The second wavelength conversion pattern 350 may convert or shift a peak wavelength of incident light into another specific peak wavelength and output light having the converted or shifted specific peak wavelength. In some embodiments, the second wavelength conversion pattern 350 may convert blue light, which is the output light L1 provided by the third light emitting element ED3, into green light in the range of about 510 nm to about 550 nm and output the green light.

In some embodiments, the second wavelength conversion pattern 350 may include a third base resin 351 and a second wavelength shifter 355 dispersed in the third base resin 351. In some embodiments, the second wavelength conversion pattern 350 may further include a third scatterer 353 dispersed in the third base resin 351.

The third base resin 351 may be made of a material having high light transmittance. In some embodiments, the third base resin 351 may be made of an organic material. In some embodiments, the third base resin 351 may be made of the same material as the first base resin 331 or may include at least one of the materials exemplified as the constituent material of the first base resin 331.

The second wavelength shifter 355 may convert or shift a peak wavelength of incident light to another specific peak wavelength. In some embodiments, the second wavelength shifter 355 may convert blue light having a peak wavelength in the range of about 440 nm to about 480 nm into green light having a peak wavelength in the range of about 510 nm to about 550 nm.

Examples of the second wavelength shifter 355 may include quantum dots, quantum rods, and phosphors. The second wavelength shifter 355 is substantially the same or similar to the first wavelength shifter 345 described above, and thus a detailed description thereof is omitted.

In some embodiments, the first wavelength shifter 345 and the second wavelength shifter 355 may all be composed of quantum dots. In such an embodiment, the particle size of quantum dots constituting the first wavelength shifter 345 may be greater than that of quantum dots constituting the second wavelength shifter 355.

The third scatterer 353 may have a refractive index different from that of the third base resin 351 and may form an optical interface with the third base resin 351. For example, the third scatterer 353 may be light scattering particles. Other details of the third scatterer 353 are substantially the same or similar to those of the second scatterer 343, and thus a detailed description thereof is omitted.

As illustrated in FIGS. 5 and 7 through 10, the second capping layer 393 may be located on (e.g., directly on) the light transmission pattern 330, the first wavelength conversion pattern 340, and the second wavelength conversion pattern 350. The second capping layer 393 may cover the light transmission pattern 330, the first wavelength conversion pattern 340, and the second wavelength conversion pattern 350. The second capping layer 393 may contact the first capping layer 391 and may seal the light transmission pattern 330, the first wavelength conversion pattern 340, and the second wavelength conversion pattern 350, thereby preventing impurities such as moisture or air from being introduced from the outside and damaging and/or contaminating the light transmission pattern 330, the first wavelength conversion pattern 340, and the second wavelength conversion pattern 350.

In some embodiments, the second capping layer 393 may be made of an inorganic material. In some embodiments, the second capping layer 393 may be made of the same material as the first capping layer 391 or may include at least one of the materials mentioned in the description of the first capping layer 391.

In some embodiments, the second capping layer 393, together with the first capping layer 391, may define the first microcavity C1, the second microcavity C2, the third microcavity C3, the fourth microcavity C4, the fifth microcavity C5, and the sixth microcavity C6.

In some embodiments, the second capping layer 393 may not cover the side C1a of the first microcavity C1, the side C2a of the second microcavity C2, the side C3a of the third microcavity C3, the side C4a of the fourth microcavity C4, the side C5a of the fifth microcavity C5, and the side C6a of the sixth microcavity C6.

As illustrated in FIGS. 5, 10 and 15, the color mixing preventing member 370 may be located on (e.g., directly on) the second capping layer 393. The color mixing preventing member 370 may be located in the light shielding region BA and may block the transmission of light. In some embodiments, the color mixing preventing member 370 may be located between the light transmission pattern 330 and the first wavelength conversion pattern 340, and between the first wavelength conversion pattern 340 and the second wavelength conversion pattern 350, to prevent color mixing between neighboring (e.g., adjacent) light transmitting regions. In some embodiments, the color mixing preventing member 370 may be formed in a stripe shape extending along the second direction D2.

In some embodiments, the color mixing preventing member 370 may be located in the first light shielding region BA1, the second light shielding region BA2, the third light shielding region BA3, the fourth light shielding region BA4, the fifth light shielding region BA5, and the sixth light shielding region BA6 of the light shielding region BA. In some embodiments, the color mixing preventing member 370 may not be located in the seventh light shielding region BA7. Alternatively, in some embodiments, a portion of the color mixing preventing member 370 may be located in the seventh light shielding region BA7.

In some embodiments, the color mixing preventing member 370 may include an organic light shielding material and may be formed by coating and exposing the organic light shielding material.

A first insulating layer 394 covering the color mixing preventing member 370 may be located on the second capping layer 393.

In some embodiments, the first insulating layer 394 may cover a top and a portion of a side of each of the microcavities C1 through C6, but may not cover the side C1a of the first microcavity C1, the side C2a of the second microcavity C2, the side C3a of the third microcavity C3, the side C4a of the fourth microcavity C4, the side C5a of the fifth microcavity C5, and the side C6a of the sixth microcavity C6.

In some embodiments, the first insulating layer 394 may be made of an organic material. The first insulating layer 394 may be hardened by a curing process to maintain the shape of each of the microcavities C1 through C6. In some embodiments, the first insulating layer 394 may be omitted.

A second insulating layer 395 may be located on (e.g., directly on) the first insulating layer 394. The second insulating layer 395 may be made of an inorganic insulating material such as silicon nitride (SiNx) or silicon oxide (SiOx). The second insulating layer 395 may cover an upper surface of the first insulating layer 394 and protect the first insulating layer 394. In some embodiments, the second insulating layer 395, like the first insulating layer 394, may not cover the side C1a of the first microcavity C1, the side C2a of the second microcavity C2, the side C3a of the third microcavity C3, the side C4a of the fourth microcavity C4, the side C5a of the fifth microcavity C5, and the side C6a of the sixth microcavity C6.

The light shielding member 380 may be located on (e.g., directly on) the second insulating layer 395. The light shielding member 380 may be located in the seventh light shielding region BA7 of the light shielding region BA. In some embodiments, the light shielding member 380 may be formed in a stripe shape extending along the first direction D1, as illustrated, for example, in FIG. 16. The light shielding member 380 may prevent or at least mitigate against light emitted from any one light emitting region from entering another unintended light transmitting region. For example, the light shielding member 380 may prevent or at least mitigate against light emitted from the first light emitting region LA1 from entering the fourth light transmitting region TA4, the fifth light transmitting region TA5, the sixth light transmitting region TA6, etc. (e.g., any region other than the first light emitting region LA1).

In some embodiments, a portion of the light shielding member 380, which is located in the seventh light shielding region BA7 in which the side C1a of the first microcavity C1, the side C2a of the second microcavity C2, the side C3a of the third microcavity C3, the side C4a of the fourth microcavity C4, the side C5a of the fifth microcavity C5, and the side C6a of the sixth microcavity C6 are located, may seal each of the microcavities C1 through C6. That is, the light shielding member 380 may function as a sealing member that seals each of the microcavities C1 through C6, and a portion of the light shielding member 380 may cover the side C1a of the first microcavity C1, the side C2a of the second microcavity C2, the side C3a of the third microcavity C3, the side C4a of the fourth microcavity C4, the side C5a of the fifth microcavity C5, and the side C6a of the sixth microcavity C6.

In some embodiments, a portion of the light shielding member 380 which seals each of the microcavities C1 through C6 may directly contact the light transmission pattern 330, the first wavelength conversion pattern 340, and the second wavelength conversion pattern 350. In addition, in some embodiments, the portion of the light shielding member 380 which seals each of the microcavities C1 through C6 may directly contact the first capping layer 391 and may also directly contact the first insulating layer 394 and the second insulating layer 395.

In some embodiments, the light shielding member 380 may include an organic light shielding material and may be formed by coating and exposing the organic light shielding material.

A third insulating layer 396 covering the light shielding member 380 may be located on (e.g., directly on) the second insulating layer 395, and a fourth insulating layer 397 may be located on (e.g., directly on) the third insulating layer 396.

The third insulating layer 396 and the fourth insulating layer 397 may seal elements located under them. In some embodiments, the third insulating layer 396 may be made of an organic insulating material, and the fourth insulating layer 397 may be made of an inorganic insulating material.

The filler 70 may be located in the space between the second substrate 30 and the first substrate 10 as described above. In some embodiments, the filler 70 may be located between the fourth insulating layer 397 and the thin-film encapsulation layer 170, as illustrated, for example, in FIGS. 5 and 7 through 10. In some embodiments, the filler 70 may directly contact the fourth insulating layer 397 and the thin-film encapsulation layer 170.

A process of manufacturing the second substrate 30 will now be described by additionally referring to FIGS. 17 through 21.

FIGS. 17, 18, 19, 20 and 21 are cross-sectional views illustrating a process of manufacturing a second substrate of a display device according to an embodiment based on the structure of FIG. 8.

Figure 17:
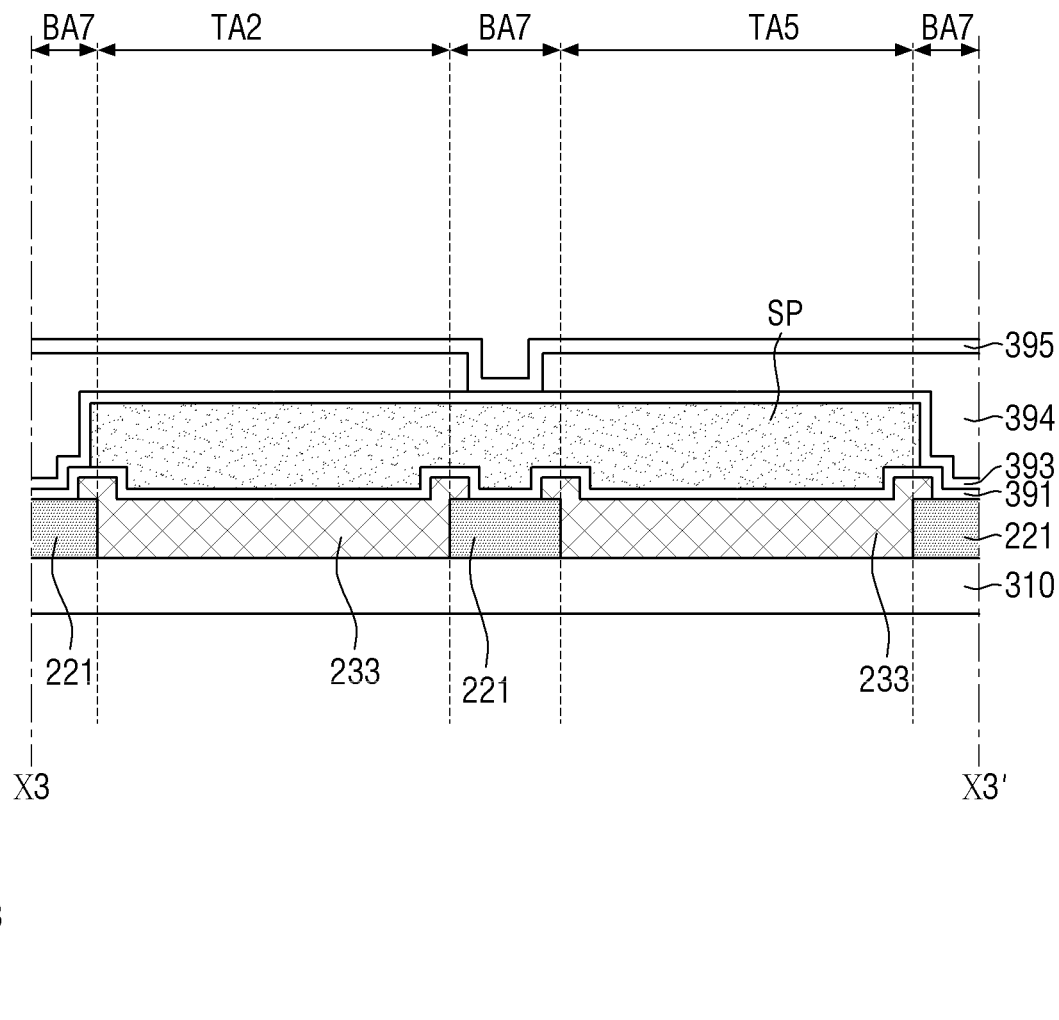
FIGS. 17, 18, 19, 20 and 21 are cross-sectional views illustrating a process of manufacturing a second substrate of a display device according to an embodiment based on the structure of FIG. 8.

Referring to FIGS. 17 through 21 in addition to FIGS. 5 through 16, first, a first color filter 231 (see FIG. 5), a second color filter 233, a third color filter 235 (see FIG. 5) and a light shielding pattern 221 are formed on a second base 310, and a first capping layer 391 is formed on the first color filer 231, the second color filter 233, the third color filer 235, and the light shielding patter 221 as illustrated in FIG. 17.

Then, a sacrificial pattern SP is formed on the first capping layer 391. The sacrificial pattern SP may be formed over two light transmitting regions neighboring each other along the second direction D2, and a portion of the sacrificial pattern SP may be located in a seventh light shielding region BA7.

In some embodiments, the sacrificial pattern SP may be formed by applying a photosensitive organic material and exposing and developing the photosensitive organic material. In some embodiments, a thickness of the sacrificial layer SP may be in a range from about 1 μm to about 20 μm.

Next, a second capping layer 393 is formed on the first capping layer 391 to cover the sacrificial pattern SP. In some embodiments, the second capping layer 393 may be made of an inorganic insulating material and may be formed using a plasma enhanced chemical vapor deposition (PECVD) process. In some embodiments, a thickness of the second capping layer 393 may be in a range of about 1000 Å to about 20000 Å.

Next, a color mixing preventing member 370 (see FIG. 5) is formed on the second capping layer 393, and a first insulating layer 394 is formed on the second capping layer 393 to cover the color mixing preventing member 370 (see FIG. 5). The first insulating layer 394 may be formed by applying a photosensitive organic material and exposing and developing the photosensitive material, and the first insulating layer 394 may be formed to expose a portion of the second capping layer 393 in the seventh light shielding region BA7.

Next, a second insulating layer 395 is formed on the first insulating layer 394. The second insulating layer 395 may be formed to cover the first insulating layer 394.

Figure 18:
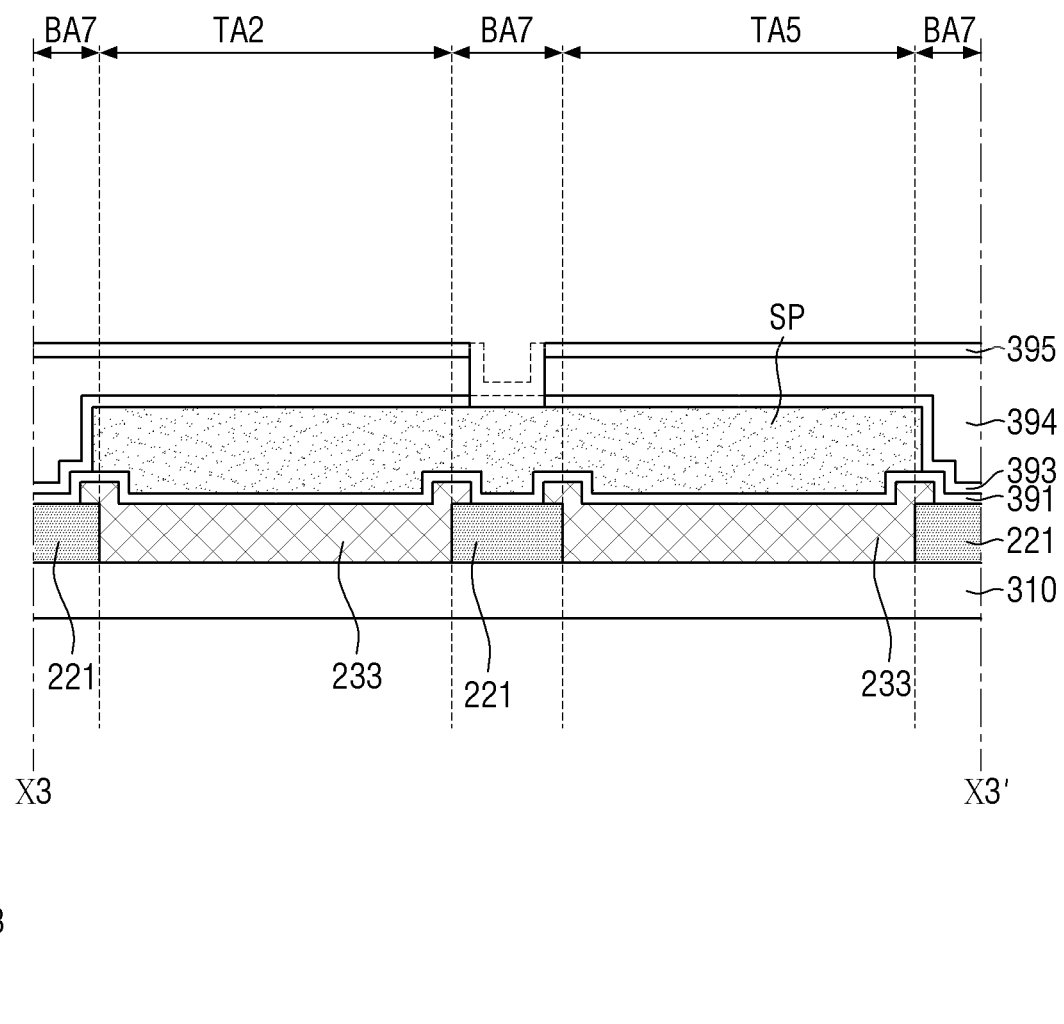

Next, as illustrated in FIG. 18, portions of the second insulating layer 395 and the second capping layer 393 which are not covered by the first insulating layer 394 in the seventh light shielding region BA7 are removed to expose the sacrificial pattern SP.

Figure 19:
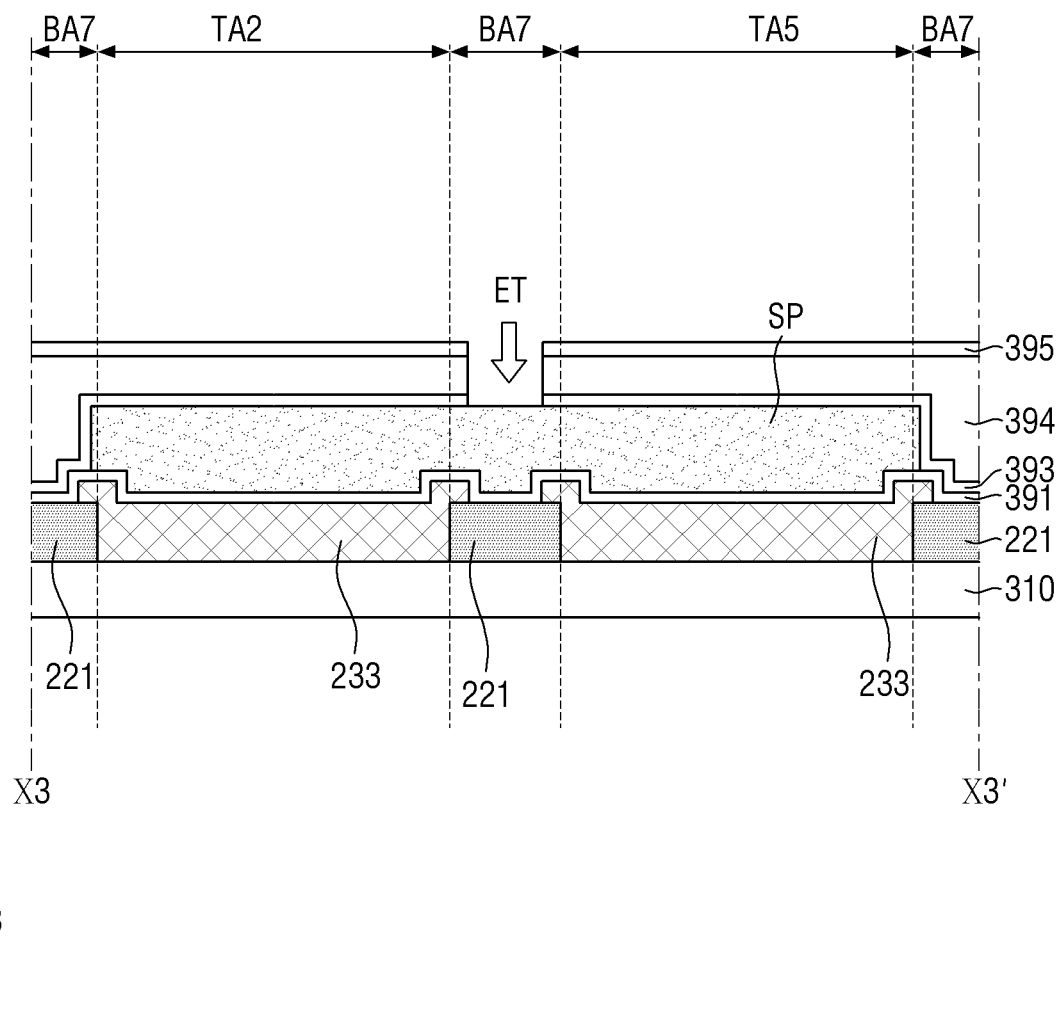

Next, as illustrated in FIG. 19, the exposed sacrificial pattern SP is removed by supplying a material ET such as a developer or a stripper solution to the exposed sacrificial pattern SP or by using an ashing (e.g., plasma ashing) process. Then, microcavities, for example, a second microcavity C2 having an open side C2a and a fifth microcavity C5 having an open side C5a are formed in the place where the sacrificial pattern SP was located, as illustrated, for example, in FIG. 20. Likewise, a first microcavity C1 (see FIG. 7), a third microcavity C3 (see FIG. 9), a fourth microcavity C4 (see FIG. 7), and a sixth microcavity C6 (see FIG. 9), each having an open side C1a, C3a, C4a, C6a, respectively, are formed.

Figure 20:
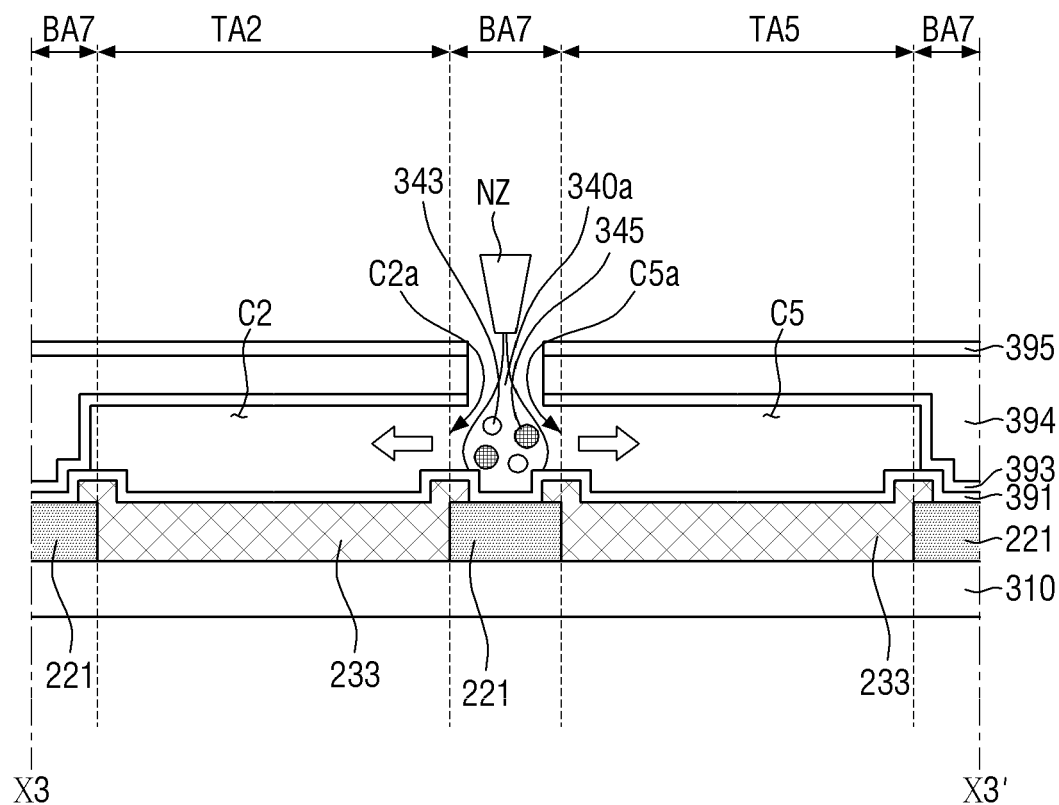

Next, when ink is ejected to the open portion of each microcavity using a nozzle NZ, the ejected ink is injected into each microcavity by capillary action. For example, when ink 340a containing a second scatterer 343 and a first wavelength shifter 345 is ejected between the side C2a of the second microcavity C2 and the side C5a of the fifth microcavity C5, as illustrated in FIG. 20, the ink 340a may be injected into the second microcavity C2 and the fifth microcavity C5 by capillary action to fill or substantially fill the second microcavity C2 and the fifth microcavity C5.

Similarly, ink containing a second wavelength shifter 355 (see FIG. 9) and a third scatterer 353 (see FIG. 9) may be provided between a side C3a (see FIG. 9) of the third microcavity C3 (see FIG. 9) and a side C6a of the sixth microcavity C6 (see FIG. 9), and ink containing a first scatterer 333 (see FIG. 7) may be provided between a side C1a (see FIG. 7) of the first microcavity C1 (see FIG. 7) and a side C4a of the fourth microcavity C4 (see FIG. 7).

Figure 21:
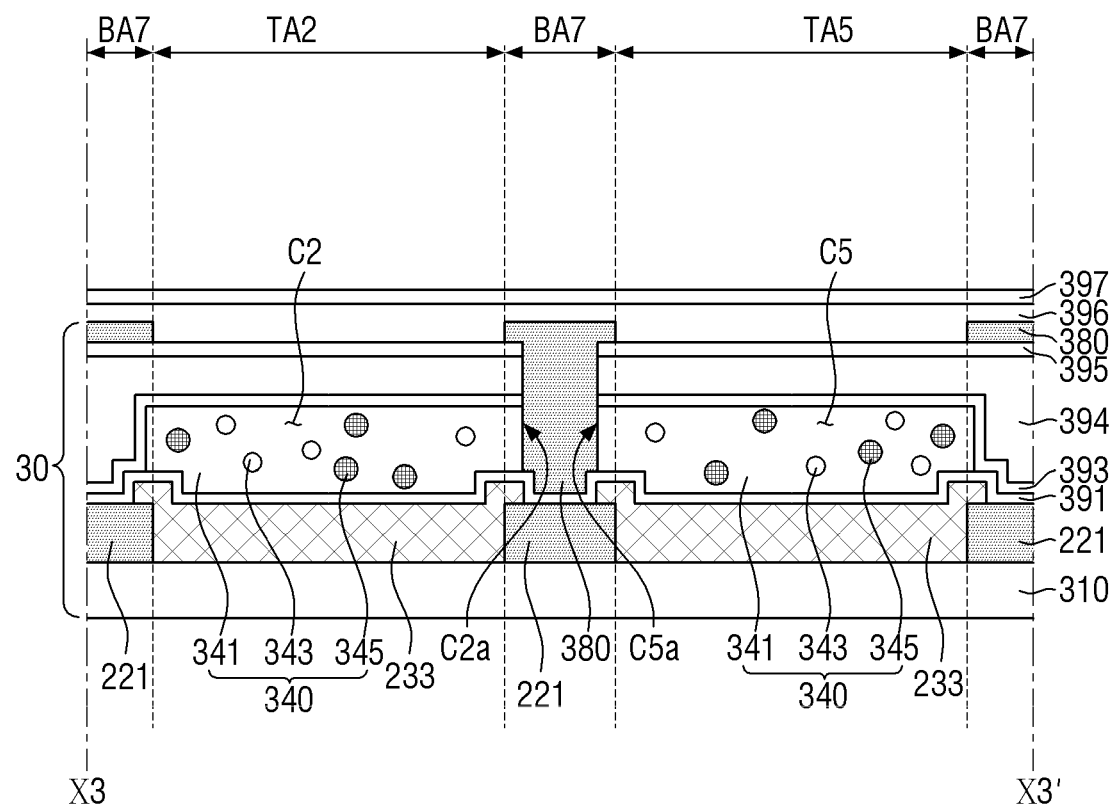

Next, a light shielding member 380 is formed on the second insulating layer 395, as illustrated, for example, in FIG. 21. A portion of the light shielding member 380 may seal the open side of each microcavity to prevent the material injected into each microcavity from flowing out of the microcavity.

Next, a third insulating layer 396 and a fourth insulating layer 397 are sequentially formed on the second insulating layer 395 to cover the light shielding member 380, thereby manufacturing a second substrate 30.

Next, the manufactured second substrate 30 and a display substrate 10 (see FIG. 10) are bonded together by a filler 70, a sealant 50 (see FIG. 3) and the like. As a result, a display device is manufactured.

In the display device according to the above-described embodiments, microcavities are defined, and ink is injected into the microcavities to form wavelength conversion patterns. Therefore, the efficiency of material use in the manufacturing process can be improved. In addition, since the size of each microcavity can be easily controlled by adjusting the size of a sacrificial pattern, the thicknesses of a light transmission pattern, a first wavelength conversion pattern, and a second wavelength conversion pattern can be easily controlled. Further, since the shape of each microcavity can be easily controlled by adjusting the shape of the sacrificial pattern, the shapes of the light transmission pattern, the first wavelength conversion pattern, and the second wavelength conversion pattern can be easily controlled.

Figure 22:
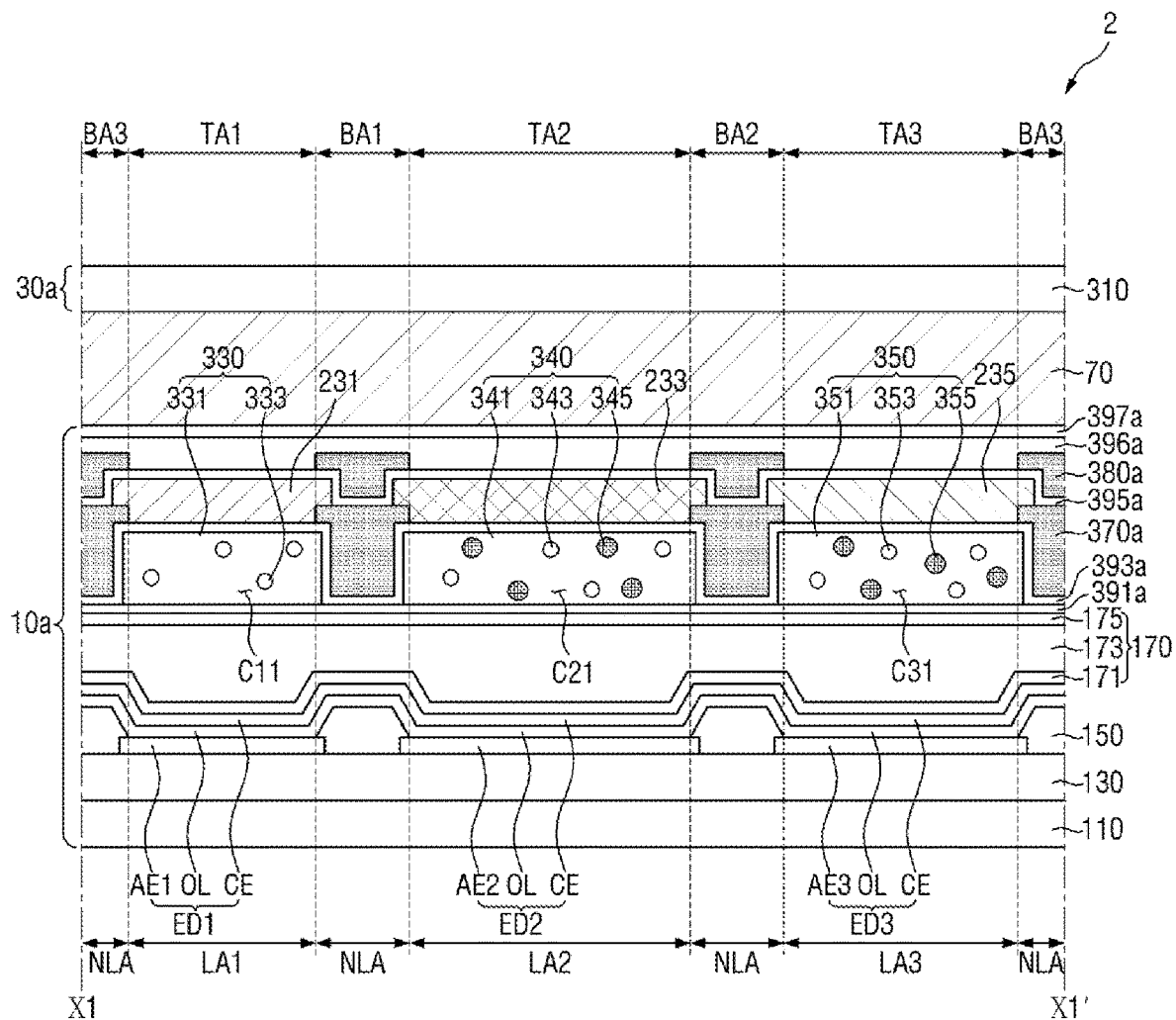
FIG. 22 is a cross-sectional view of a display device according to an embodiment, taken along X1-X1' of FIGS. 3 and 4.
Figure 23:
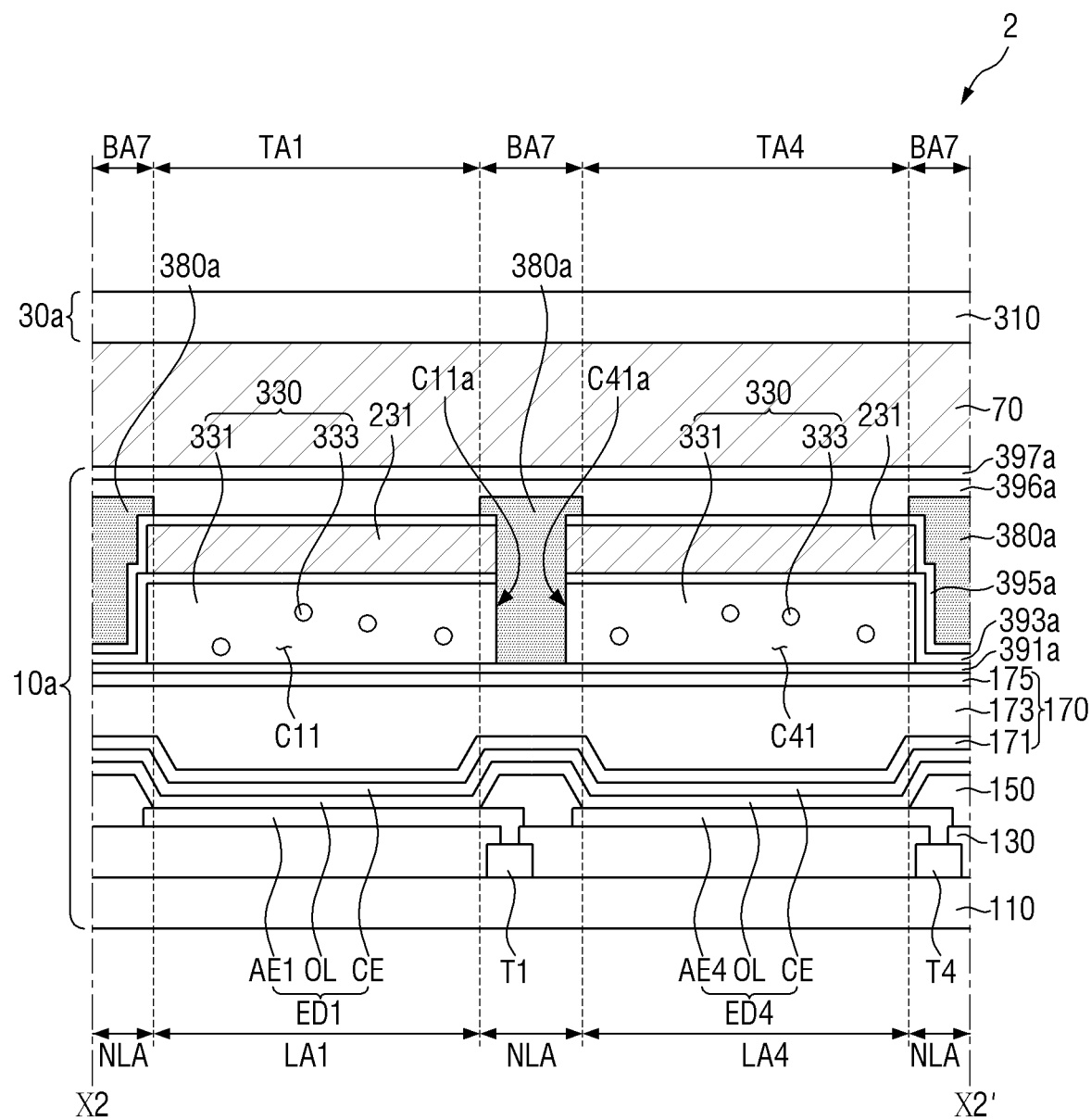
FIG. 23 is a cross-sectional view of the display device according to the embodiment of FIG. 22, taken along X2-X2' of FIGS. 3 and 4.
Figure 24:
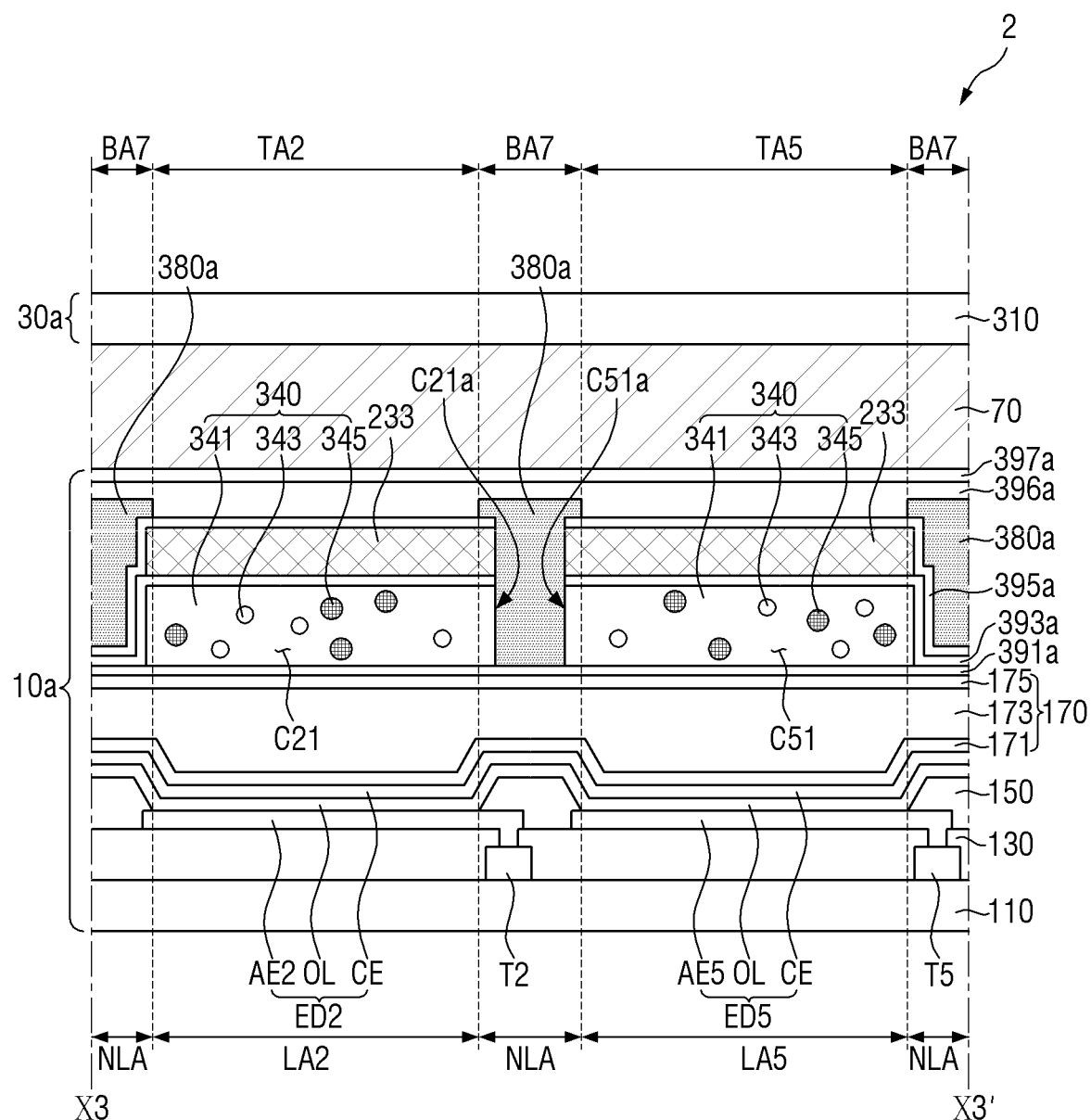
FIG. 24 is a cross-sectional view of the display device according to the embodiment of FIG. 22, taken along X3-X3' of FIGS. 3 and 4.
Figure 25:
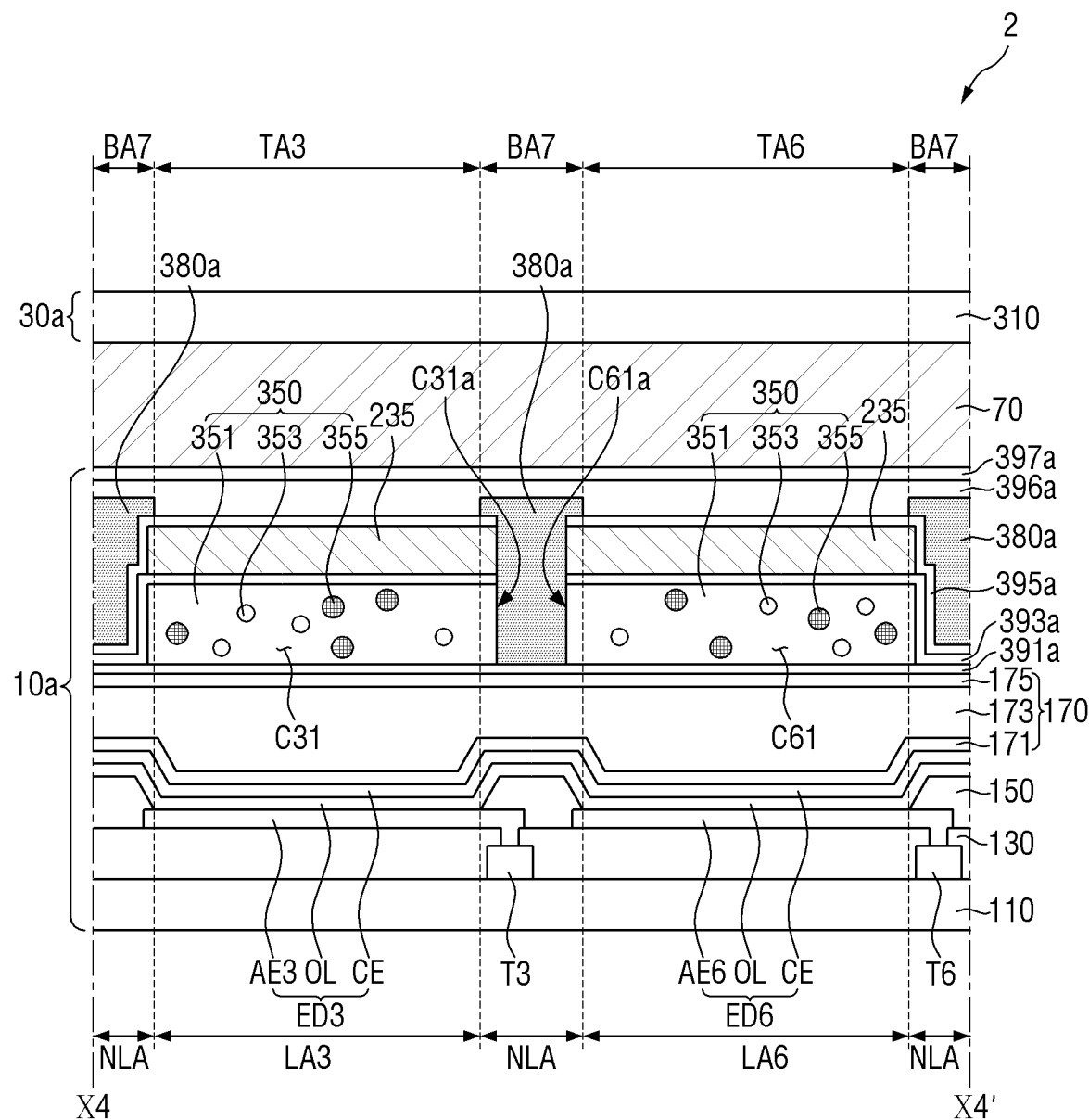
FIG. 25 is a cross-sectional view of the display device according to the embodiment of FIG. 22, taken along X4-X4' of FIGS. 3 and 4.
Figure 26:
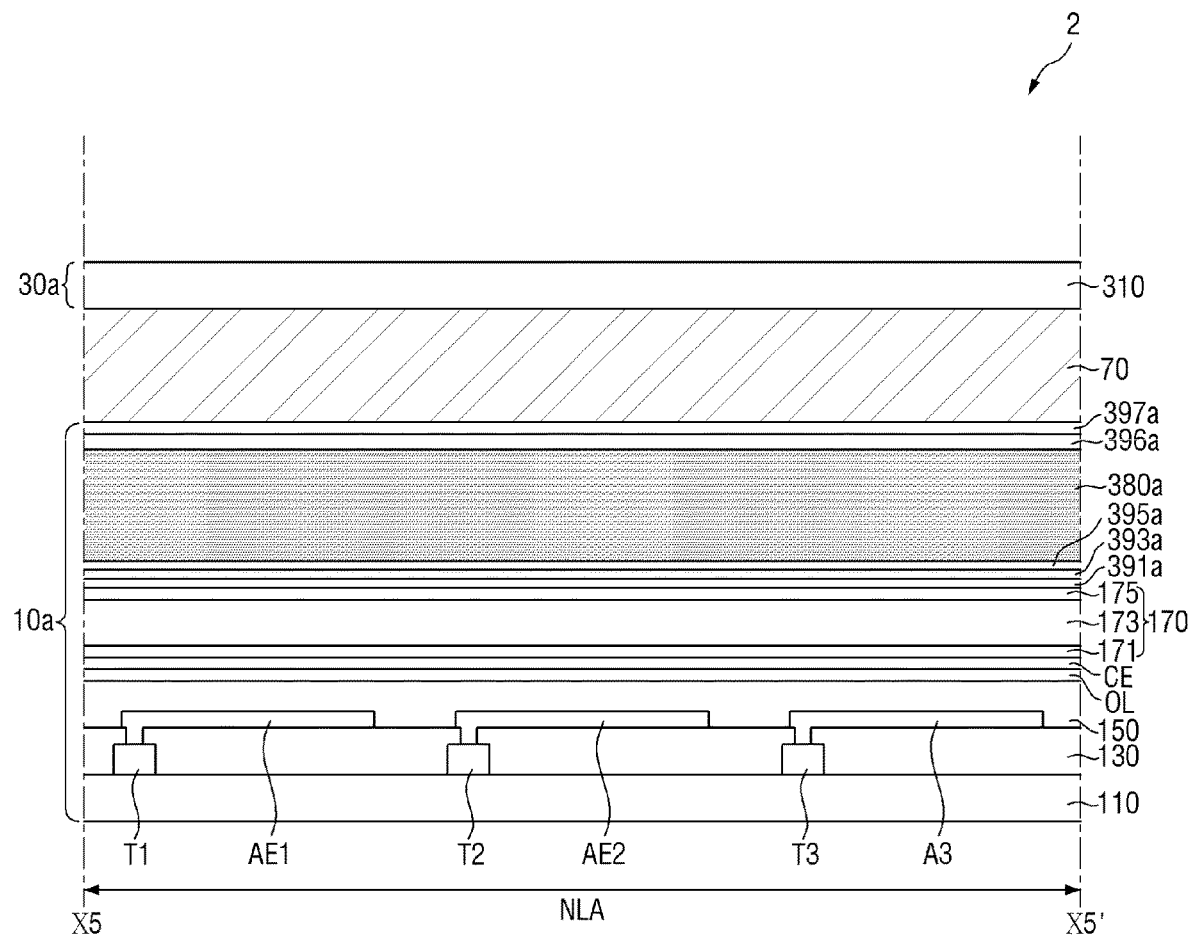
FIG. 26 is a cross-sectional view of the display device according to the embodiment of FIG. 22, taken along X5-X5' of FIGS. 3 and 4.
Figure 27:
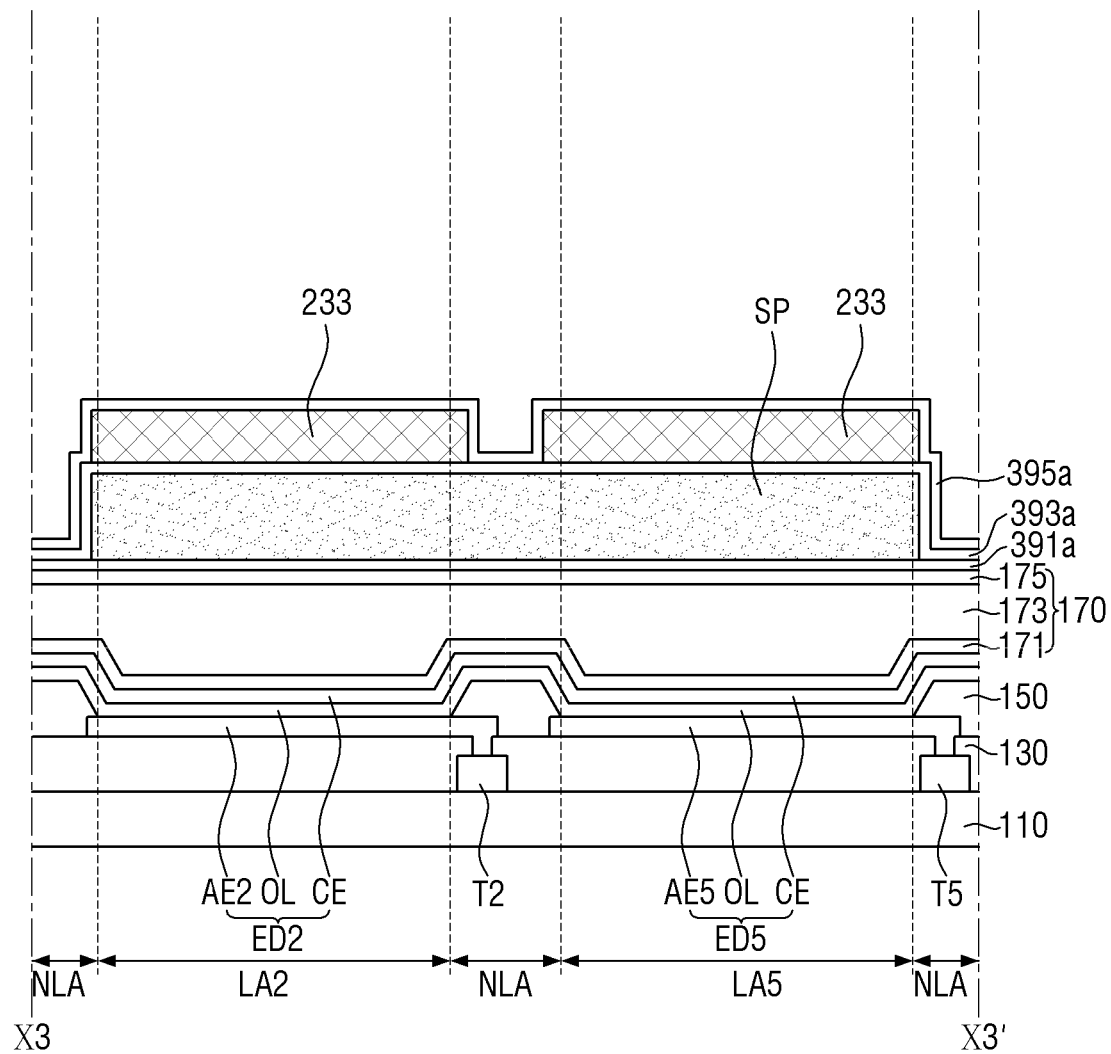
FIGS. 27, 28, 29, 30 and 31 are cross-sectional views illustrating a process of manufacturing a first substrate of a display device according to an embodiment based on the structure of FIG. 24.

FIG. 22 is a cross-sectional view of a display device 2 according to an embodiment, taken along X1-X1' of FIGS. 3 and 4. FIG. 23 is a cross-sectional view of the display device 2 according to the embodiment, taken along X2-X2' of FIGS. 3 and 4. FIG. 24 is a cross-sectional view of the display device 2 according to the embodiment, taken along X3-X3' of FIGS. 3 and 4. FIG. 25 is a cross-sectional view of the display device 2 according to the embodiment, taken along X4-X4' of FIGS. 3 and 4. FIG. 26 is a cross-sectional view of the display device 2 according to the embodiment, taken along X5-X5' of FIGS. 3 and 4.

Referring to FIGS. 22 through 26, the display device 2 according to the illustrated embodiment is substantially the same or similar to the embodiment of FIG. 5 except that a first substrate 10a includes all elements of the second substrate 30 (see FIG. 5) of FIG. 5 excluding the second base 310 and that a second substrate 30b includes only the second base 310, unlike the second substrate 30 (see FIG. 3). Therefore, the description of the current embodiment below focuses mainly on differences, and a description of the same or similar elements as those of the previous embodiment will be given briefly or omitted.

The first substrate 10a will now be described.

A description of a first base 110, a description of elements located between the first base 110 and a thin-film encapsulation layer 170, and a description of the thin-film encapsulation layer 170 are the same as above.

A first capping layer 391a may be located on the thin-film encapsulation layer 170. In some embodiments, the first capping layer 391a may contact the thin-film encapsulation layer 170. A more detailed description of the first capping layer 391a is substantially the same as the description of the first capping layer 391 (see FIG. 5) of the display device 1 (see FIG. 5).

Microcavities may be located on the first capping layer 391a. For example, a first microcavity C11, a second microcavity C21, a third microcavity C31, a fourth micrcavity C41, a fifth microcavity C51, and a sixth microcavity C61 may be located on the first capping layer 391a.

The first microcavity C11 may be located in a first light emitting region LA1 and may include an open side C11a. The second microcavity C21 may be located in a second light emitting region LA2 and may include an open side C21a. The third microcavity C31 may be located in a third light emitting region LA3 and may include an open side C31a. The fourth microcavity C41 may be located in a fourth light emitting region LA4 and may include an open side C41a. The fifth microcavity C51 may be located in a fifth light emitting region LA5 and may include an open side C51a. The sixth microcavity C61 may be located in a sixth light emitting region LA6 and may include an open side C61a.

The first microcavity C11, the second microcavity C21, the third microcavity C31, the fourth microcavity C41, the fifth microcavity C51, and the sixth microcavity C61 may be located between the first capping layer 391a and a second capping layer 393a which will be described later. The planar arrangement of the microcavities may be substantially the same or similar to the structure illustrated in FIG. 13.

A light transmission pattern 330, a first wavelength conversion pattern 340, and a second wavelength conversion pattern 350 may be located on (e.g., directly on) the first capping layer 391a.

The light transmission pattern 330 may be located on the first capping layer 391a and may be located in the first light emitting region LA1 and the fourth light emitting region LA4. In some embodiments, the light transmission pattern 330 may be located in the first microcavity C11 and the fourth microcavity C41 and may fill or substantially fill the first microcavity C11 and the fourth microcavity C41.

The first wavelength conversion pattern 340 may be located on (e.g., directly on) the first capping layer 391a and may be located in the second light emitting region LA2 and the fifth light emitting region LA5. In some embodiments, the first wavelength conversion pattern 340 may be located in the second microcavity C21 and the fifth microcavity C51 and may fill or substantially fill the second microcavity C21 and the fifth microcavity C51.

The second wavelength conversion pattern 350 may be located on (e.g., directly on) the first capping layer 391a and may be located in the third light emitting region LA3 and the sixth light emitting region LA6. In some embodiments, the second wavelength conversion pattern 350 may be located in the third microcavity C31 and the sixth microcavity C61 and may fill or substantially fill the third microcavity C31 and the sixth microcavity C61.

Other details of the light transmission pattern 330, the first wavelength conversion pattern 340, and the second wavelength conversion pattern 350 are the same as those described above, and thus a detailed description thereof is omitted.

The second capping layer 393a may be located on (e.g., directly on) the light transmission pattern 330, the first wavelength conversion pattern 340, and the second wavelength conversion pattern 350. The second capping layer 393a may cover the light transmission pattern 330, the first wavelength conversion pattern 340, and the second wavelength conversion pattern 350. A more detailed description of the second capping layer 393a is omitted because it is substantially the same as the description of the second capping layer 393 (see FIG. 5) of the display device 1 (see FIG. 5).

A color mixing preventing member 370a may be located on (e.g., directly on) the second capping layer 393a. The color mixing preventing member 370a may be located in a non-light emitting region NLA to block the transmission of light. In some embodiments, the color mixing preventing member 370a may be located between the light transmission pattern 330 and the first wavelength conversion pattern 340, and between the first wavelength conversion pattern 340 and the second wavelength conversion pattern 350, to prevent color mixing between neighboring (e.g., adjacent) light transmitting regions. In some embodiments, the planar structure of the color mixing preventing member 370a may be substantially the same or similar to that of the color mixing preventing member 370 (see FIG. 16) illustrated in FIG. 16.

A first color filter 231, a second color filter 233, and a third color filter 235 may be located on (e.g., directly on) the second capping layer 393a. A portion of each of the first color filter 231, the second color filter 233, and the third color filter 235 may be located on (e.g., directly on) the color mixing preventing member 370a.

The first color filter 231 may be located in the first light emitting region LA1 and the fourth light emitting region LA4, the second color filter 233 may be located in the second light emitting region LA2 and the fifth light emitting region LA5, and the third color filter 235 may be located in the third light emitting region LA3 and the sixth light emitting region LA6.

In some embodiments, the first color filter 231, the second color filter 233, and the third color filter 235 may maintain the shape of each of the microcavities C11 through C61.

In some embodiments, the first color filter 231 may cover a portion of a side and a top of each of the first microcavity C11 and the fourth microcavity C41, but may not cover the side C11a of the first microcavity C11 and the side C41a of the fourth microcavity C41. In addition, the second color filter 233 may cover a portion of a side and a top of each of the second microcavity C21 and the fifth microcavity C51, but may not cover the side C21a of the second microcavity C21 and the side C51a of the fifth microcavity C51. Further, the third color filter 235 may cover a portion of a side and a top of each of the third microcavity C31 and the sixth microcavity C61, but may not cover the side C31a of the third microcavity C31 and the side C61a of the sixth microcavity C61.

Other details of the first color filter 231, the second color filter 233, and the third color filter 235 are the same or substantially the same as those described above.

A first insulating layer 395a may be located on (e.g., directly on) the first color filter 231, the second color filter 233, and the third color filter 235. The first insulating layer 395a may be made of an inorganic insulating material and may not cover the sides C11a, C21a, C31a, C41a, C51a or C61a of each of the microcavities C11 through C61, respectively. Other details of the first insulating layer 395a are substantially the same as those of the second insulating layer 395 (see FIG. 5) of the display device 1 (see FIG. 5), and thus a detailed description thereof is omitted.

A light shielding member 380a may be located on (e.g., directly on) the first insulating layer 395a. The light shielding member 380a may be located in the non-light emitting region NLA and may overlap a light shielding region BA.

In some embodiments, the planar shape of the light shielding member 380a may be a lattice shape, like the light shielding pattern 221 (see FIG. 11) illustrated in FIG. 11.

In some embodiments, a portion of the light shielding member 380a, which overlaps a seventh light shielding region BA7, may seal each of the mircocavities C11 through C61. That is, a portion of the light shielding member 380a may cover the side C11a of the first microcavity C11, the side C21a of the second microcavity C21, the side C31a of the third microcavity C31, the side C41a of the fourth microcavity C41, the side C51a of the fifth microcavity C51, and the side C61a of the sixth microcavity C61.

The portion of the light shielding member 380a which overlaps the seventh light shielding region BA7 may directly contact the light transmission pattern 330, the first wavelength conversion pattern 340, and the second wavelength conversion pattern 350.

In some embodiments, the light shielding member 380a may include an organic light shielding material and may be formed by coating and exposing the organic light shielding material.

A second insulating layer 396a covering the light shielding member 380a may be located on the first insulating layer 395a, and a third insulating layer 397a may be located on the second insulating layer 396a.

The second insulating layer 396a and the third insulating layer 397a may seal elements located under them. In some embodiments, the second insulating layer 396a may be made of an organic insulating material, and the third insulating layer 397a may be made of an inorganic insulating material.

The second substrate 30a including the second base 310 may be located on the first substrate 10a, and a filler 70 may be located between the second substrate 30a and the first substrate 10a.

In the current embodiment, the second substrate 30a and the filler 70 can be omitted.

In the display device 2 according to the current embodiment, it is possible to reduce an alignment tolerance between elements located in each light emitting region (e.g., an alignment tolerance between a light emitting element and a wavelength conversion pattern, an alignment tolerance between a pixel defining layer and a color mixing preventing member, and/or an alignment tolerance between the pixel defining layer and a light shielding member).

A process of manufacturing the first substrate 10a will now be described with reference to FIGS. 27 through 31, focusing mainly on a process of manufacturing elements located on the thin-film encapsulation layer 170.

FIGS. 27, 28, 29, 30 and 31 are cross-sectional views illustrating a process of manufacturing a first substrate of a display device according to an embodiment based on the structure of FIG. 24.

Referring to FIGS. 27 through 31 in addition to FIGS. 22 through 26, first, a first capping layer 391a is formed on a thin-film encapsulation layer 170, and a sacrificial pattern SP is formed on the first capping layer 391a. The sacrificial pattern SP may be formed over two light emitting regions neighboring each other along the second direction D2 (see FIG. 3), and a portion of the sacrificial pattern SP may be located in a non-light emitting region NLA. Other details of the sacrificial pattern SP may be substantially the same or similar to those of the sacrificial pattern SP described above with reference to FIGS. 17 through 21.

Next, a second capping layer 393a is formed on the first capping layer 391a to cover the sacrificial pattern SP, a color mixing preventing member 370a (see FIG. 22) is formed on the second capping layer 393a, and then a first color filter 231, a second color filter 233, and a third color filter 235 are formed.

Next, a first insulating layer 395a is formed on the first color filter 231, the second color filter 233, and the third color filter 235. The first insulating layer 395a may be formed to cover the second capping layer 393a.

Figure 28:
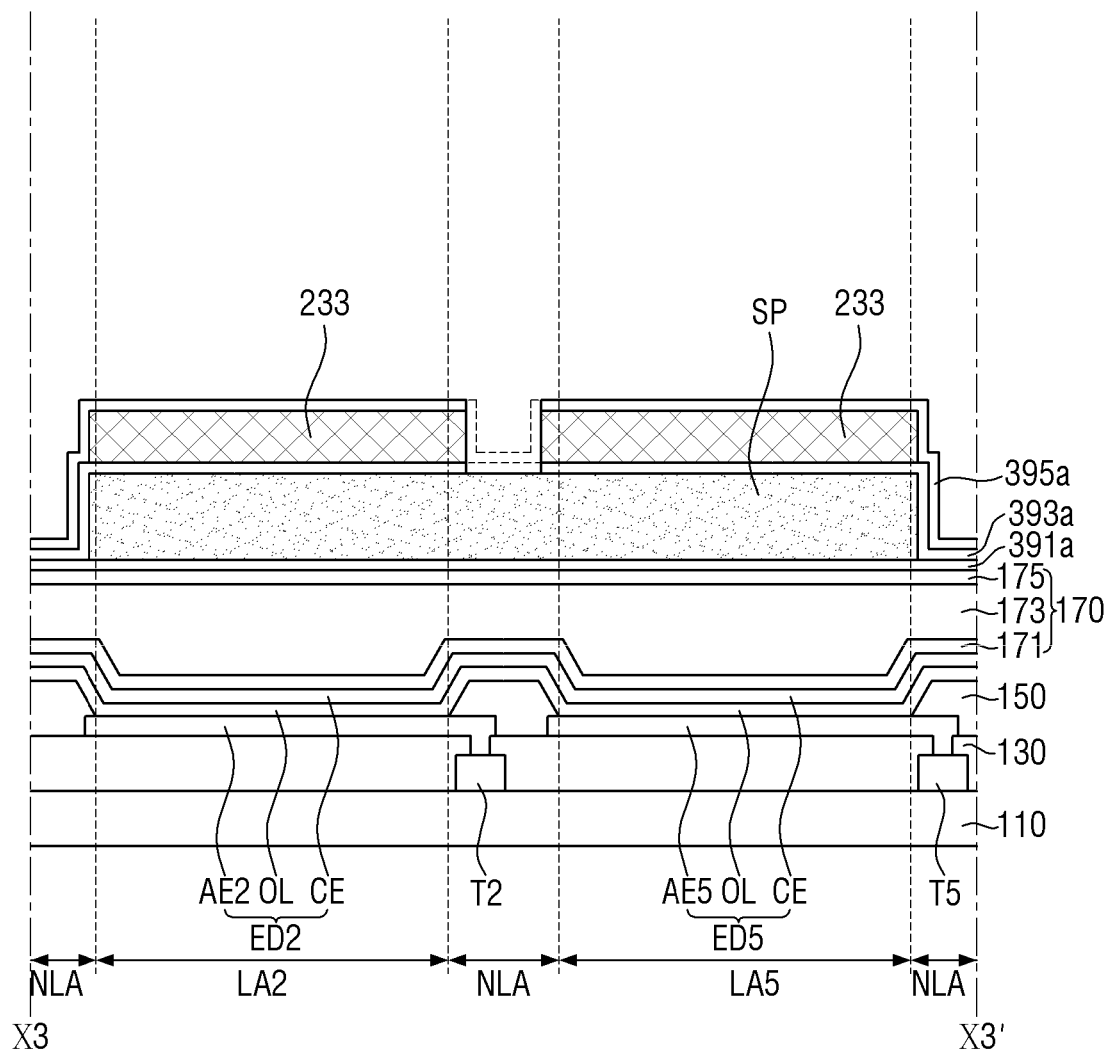

Next, as illustrated in FIG. 28, the first insulating layer 395a and the second capping layer 393a in the non-light emitting region NLA are removed to expose the sacrificial pattern SP.

Figure 29:
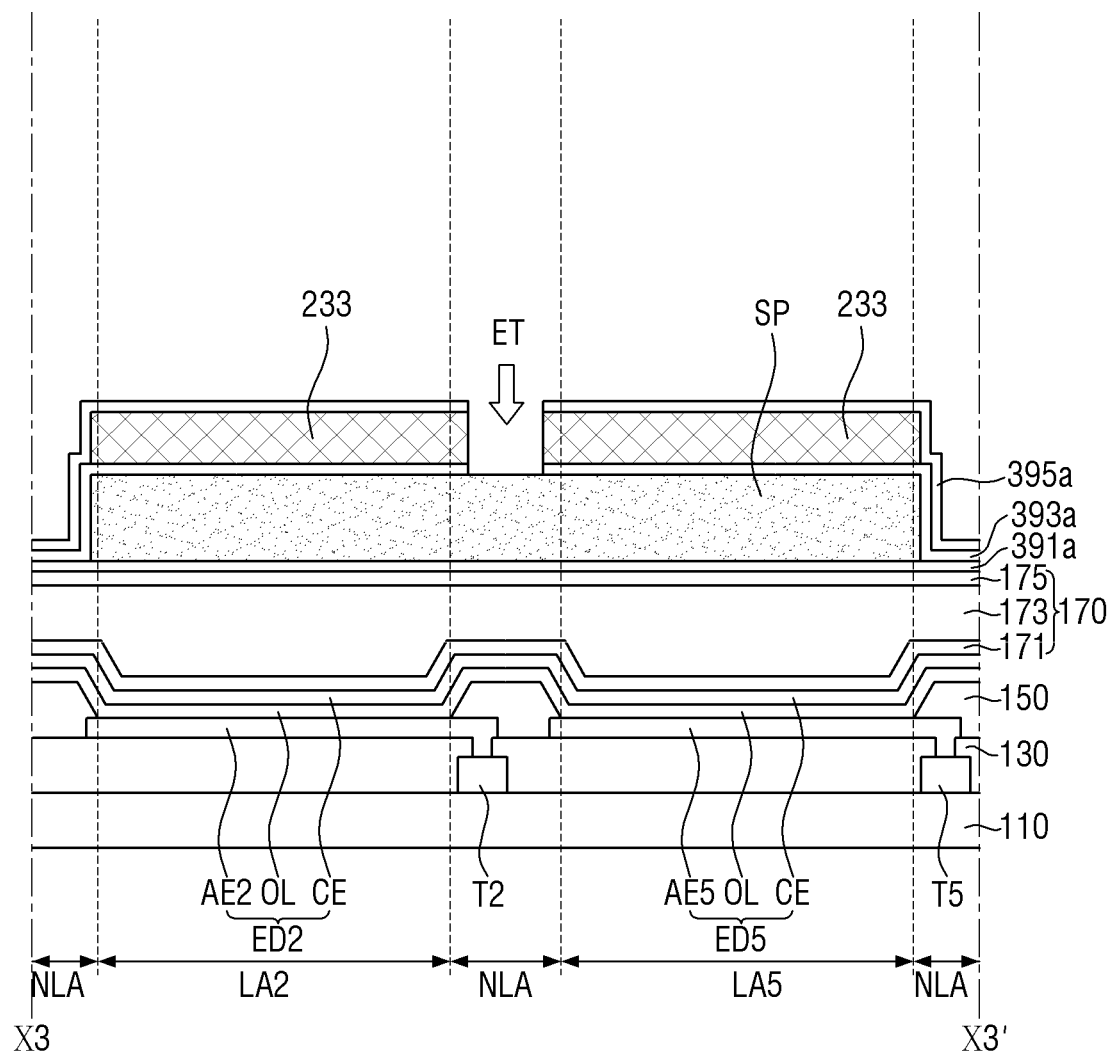
Figure 30:
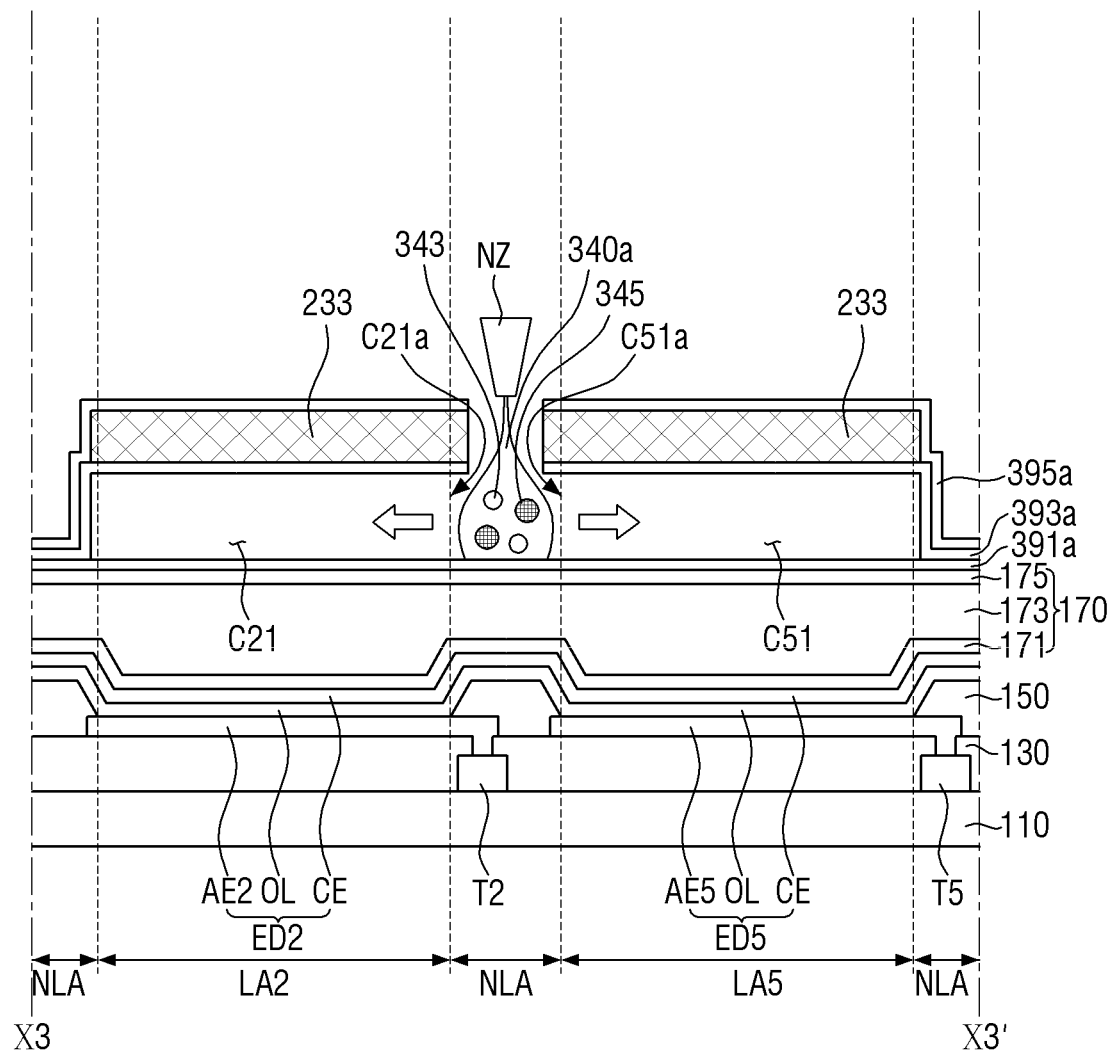

Next, as illustrated in FIG. 29, the exposed sacrificial pattern SP is removed by supplying a material ET such as a developer or a stripper solution to the exposed sacrificial pattern SP or by using an ashing (e.g., plasma ashing) process. Then, microcavities are formed in the place where the sacrificial pattern SP was located. In FIG. 30, a second microcavity C21 having an open side C21a and a fifth microcavity C51 having an open side C51a are illustrated by way of example.

When ink is ejected to the open portion of each microcavity using a nozzle NZ, the ejected ink is injected into each microcavity by capillary action. In FIG. 30, a process of injecting ink 340a containing a second scatterer 343 and a first wavelength shifter 345 into the second microcavity C21 and the fifth microcavity C51 is illustrated by way of example.

Figure 31:
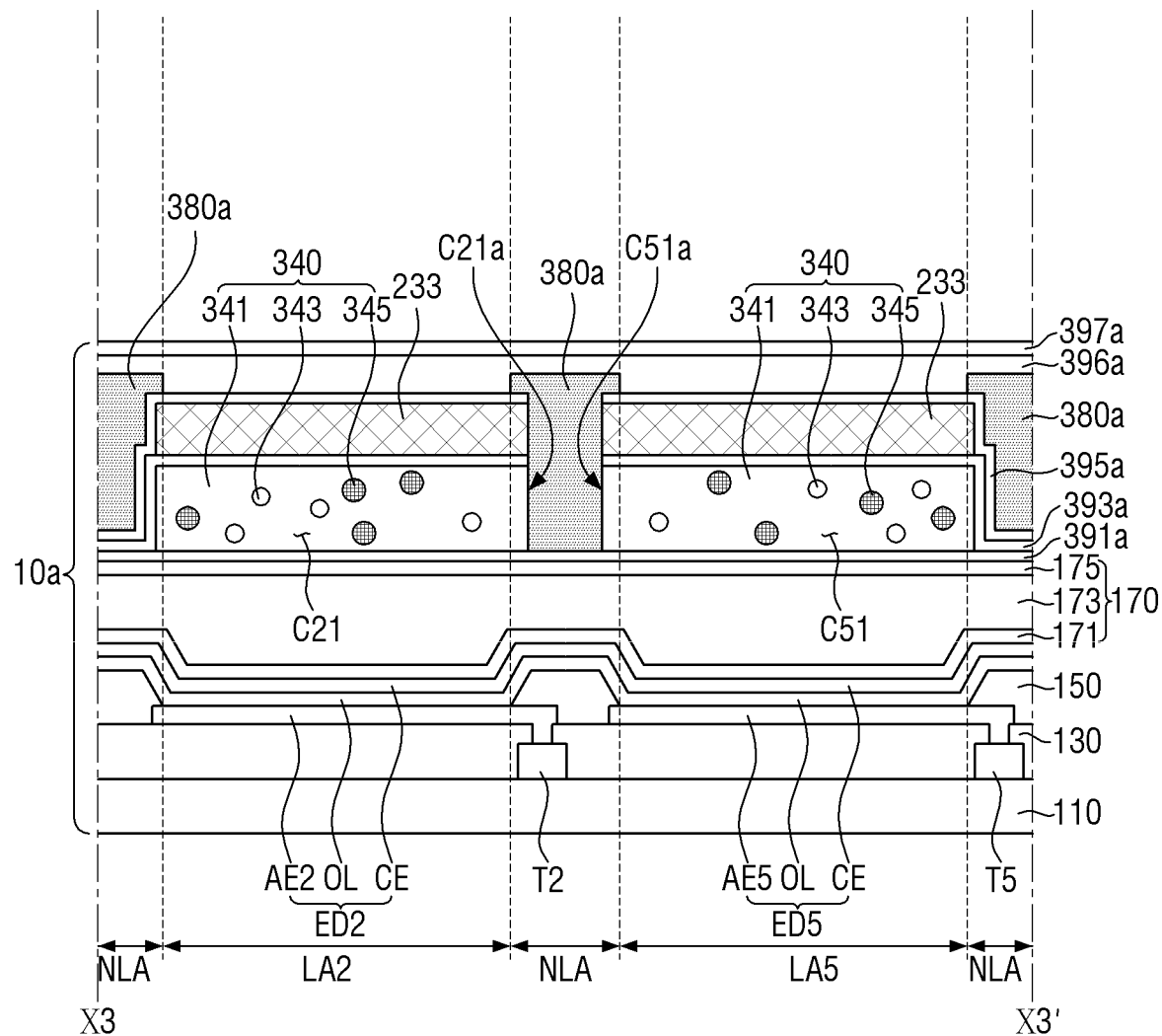

Next, a light shielding member 380a is formed on the first insulating layer 395a, as illustrated in FIG. 31. The light shielding member 380a may be formed in a lattice shape in plan view, and a portion of the light shielding member 380a may seal the open side C11a through C61a of each microcavity C11 through C61, respectively.

Next, a second insulating layer 396a and a third insulating layer 397a are sequentially formed on the first insulating layer 395a to cover the light shielding member 380a, thereby manufacturing a first substrate 10a.

The display device 2 according to the above-described embodiment can reduce the possibility of misalignment between elements, can easily control the thicknesses of a light transmission pattern, a first wavelength conversion pattern, and a second wavelength conversion pattern by adjusting sizes of microcavities, and can easily control the shapes of the light transmission pattern, the first wavelength conversion pattern, and the second wavelength conversion pattern by adjusting the shape of a sacrificial pattern.

According to embodiments, it is possible to provide a display device having improved display quality compared to related art display devices.

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A color conversion substrate comprising:
   a base comprising a first light transmitting region and a light shielding region around the first light transmitting region;
   a first color filter on the base in the first light transmitting region;
   a first wavelength conversion pattern comprising a first wavelength shifter, the first wavelength conversion pattern being in a first microcavity on the first color filter;
   a light shielding member on the base and in the light shielding region;
   a first capping layer on the first color filter; and
   a second capping layer on the first wavelength conversion pattern,
   wherein the first microcavity comprises an open side,
   wherein the light shielding member directly contacts the first wavelength conversion pattern at the open side of the first microcavity, and
   wherein the first microcavity is defined between the first capping layer and the second capping layer.

2. The color conversion substrate of claim 1, further comprising:
   a first insulating layer on the second capping layer, the first insulating layer comprising an organic insulating material; and
   a second insulating layer on the first insulating layer, the second insulating layer comprising an inorganic insulating material,
   wherein the light shielding member directly contacts the first insulating layer.

3. The color conversion substrate of claim 2, further comprising:
   a third insulating layer on the second insulating layer and covering the light shielding member; and
   a fourth insulating layer on the third insulating layer,
   wherein the first insulating layer comprises an organic insulating material, and
   wherein the second insulating layer comprises an inorganic insulating material.

4. A color conversion substrate comprising:
   a base comprising a first light transmitting region and a light shielding region around the first light transmitting region;
   a first color filter on the base in the first light transmitting region;
   a first wavelength conversion pattern comprising a first wavelength shifter, the first wavelength conversion pattern being in a first microcavity on the first color filter; and
   a light shielding member on the base and in the light shielding region,
   wherein the first microcavity comprises an open side,
   wherein the first microcavity comprises a sealed side opposite to the open side,
   wherein the light shielding member directly contacts the first wavelength conversion pattern at the open side of the first microcavity, and
   wherein:
   the base further comprises a second light transmitting region adjacent to the first light transmitting region along the first direction, the first light transmitting region and the light shielding region are adjacent to each other along a second direction intersecting the first direction, the color conversion substrate further comprises a second color filter on the base and in the second light transmitting region, the color conversion substrate further comprises a second wavelength conversion pattern in a second microcavity on the second color filter the second wavelength conversion pattern comprises a second wavelength shifter, the second microcavity comprises an open side, and the light shielding member directly contacts the second wavelength conversion pattern at the open side of the second microcavity.

5. The color conversion substrate of claim 4, further comprising a color mixing preventing member between the first wavelength conversion pattern and the second wavelength conversion pattern.

6. The color conversion substrate of claim 5, further comprising a capping layer on the first wavelength conversion pattern and the second wavelength conversion pattern, wherein the color mixing preventing member is on the capping layer.

7. The color conversion substrate of claim 6, further comprising an insulating layer on the color mixing preventing member,
wherein the color mixing preventing member is between the capping layer and the insulating layer, and
wherein the light shielding member comprises a portion located on the insulating layer.

8. The color conversion substrate of claim 4, further comprising:
a third light transmitting region in the base;
a third color filter on the base and in the third light transmitting region; and
a light transmission pattern in a third microcavity on the third color filter,
wherein third light transmitting region is on a side of the first light transmitting region along the first direction and opposite the second light transmitting region,
wherein the first light transmitting region is between the third light transmitting region and the second light transmitting region,
wherein third microcavity comprises an open side, and
wherein the light shielding member directly contacts the light transmission pattern at the open side of the third microcavity.

9. The color conversion substrate of claim 8, wherein:
the third color filter comprises a blue colorant,
any one of the first color filter and the second color filter comprises a red colorant,
the other one of the first color filter and the second color filter comprises a green colorant, and
the first wavelength shifter and the second wavelength shifter comprise quantum dots.

10. The color conversion substrate of claim 8, wherein:
the base defines a fourth light transmitting region opposite the first light transmitting region,
the light shielding region is between the fourth light transmitting region and the first light transmitting region,
the first color filter is in the fourth light transmitting region,
the first wavelength conversion pattern is in a fourth microcavity on the first color filter in the fourth light transmitting region, the fourth microcavity comprises an open side, and
the open side of the first microcavity and the open side of the fourth microcavity face each other.

11. A display device comprising:
a first base comprising a first light emitting region, a second light emitting region, and a non-light emitting region surrounding the first light emitting region and the second light emitting region;
a first anode on the first base and in the first light emitting region;
a second anode on the first base and in the second light emitting region;
a light emitting layer on the first anode and the second anode;
a cathode on the light emitting layer;
a filler on the cathode;
a second base on the filler;
a first color filter on a surface of the second base facing the first base and overlapping the first light emitting region;
a second color filter on the surface of the second base and overlapping the second light emitting region;
a first wavelength conversion pattern in a first microcavity on the first color filter, the first wavelength conversion pattern comprising a first wavelength shifter;
a second wavelength conversion pattern in a second microcavity on the second color filter, the second wavelength conversion pattern comprising a second wavelength shifter; and
a light shielding member on the surface of the second base and overlapping the non-light emitting region,
wherein the first microcavity and the second microcavity each comprise an open side,
wherein the first microcavity and the second microcavity each comprise a sealed side opposite to the open side, and
wherein the light shielding member directly contacts the first wavelength conversion pattern at the open side of the first microcavity and directly contacts the second wavelength conversion pattern at the open side of the second microcavity.

12. The display device of claim 11, wherein the light emitting layer comprises two or more blue light emitting layers overlapping each other.

13. The display device of claim 12, wherein:
the first color filter comprises a red colorant,
the second color filter comprises a green colorant, and
the first wavelength shifter and the second wavelength shifter comprise quantum dots.

14. A display device comprising:
a first base comprising a first light emitting region, a second light emitting region, and a non-light emitting region surrounding the first light emitting region and the second light emitting region;
a first anode on the first base and in the first light emitting region;
a second anode on the first base and in the second light emitting region;
a light emitting layer on the first anode and the second anode;
a cathode on the light emitting layer;
a thin-film encapsulation layer on the cathode;
a first microcavity on the thin-film encapsulation layer and in the first light emitting region;
a second microcavity on the thin-film encapsulation layer and in the second light emitting region;

a first wavelength conversion pattern in the first microcavity, the first wavelength conversion pattern comprising a first wavelength shifter;
a second wavelength conversion pattern in the second microcavity, the second wavelength conversion pattern comprising a second wavelength shifter;
a first color filter on the first wavelength conversion pattern;
a second color filter on the second wavelength conversion pattern; and
a light shielding member on the thin-film encapsulation layer and in the non-light emitting region,
wherein the first microcavity and the second microcavity each comprise an open side,
wherein the first microcavity and the second microcavity each comprise a sealed side opposite to the open side, and
wherein the light shielding member directly contacts the first wavelength conversion pattern at the open side of the first microcavity and directly contacts the second wavelength conversion pattern at the open side of the second microcavity.

15. A display device comprising:
a first base comprising a first light emitting region, a second light emitting region, and a non-light emitting region surrounding the first light emitting region and the second light emitting region;
a first anode on the first base and in the first light emitting region;
a second anode on the first base and in the second light emitting region;
a light emitting layer on the first anode and the second anode;
a cathode on the light emitting layer;
a thin-film encapsulation layer on the cathode;
a first microcavity on the thin-film encapsulation layer and in the first light emitting region;
a second microcavity on the thin-film encapsulation layer and in the second light emitting region;
a first wavelength conversion pattern in the first microcavity, the first wavelength conversion pattern comprising a first wavelength shifter;
a second wavelength conversion pattern in the second microcavity, the second wavelength conversion pattern comprising a second wavelength shifter;
a first color filter on the first wavelength conversion pattern;
a second color filter on the second wavelength conversion pattern;
a light shielding member on the thin-film encapsulation layer and in the non-light emitting region; and
a first capping layer and a second capping layer on the thin-film encapsulation layer,
wherein the first color filter and the second color filter are on the second capping layer,
wherein the first microcavity and the second microcavity are defined between the first capping layer and the second capping layer,
wherein the first microcavity and the second microcavity each comprise an open side, and
wherein the light shielding member directly contacts the first wavelength conversion pattern at the open side of the first microcavity and directly contacts the second wavelength conversion pattern at the open side of the second microcavity.

16. The display device of claim 15, further comprising a color mixing preventing member between the first wavelength conversion pattern and the second wavelength conversion pattern and in the non-light emitting region, wherein each of the first color filter and the second color filter comprises a portion located on the color mixing preventing member.

17. The display device of claim 15, further comprising a first insulating layer on the first color filter and the second color filter, wherein the light shielding member comprises a portion located on the first insulating layer.

18. The display device of claim 17, further comprising:
a second insulating layer on the first insulating layer, the second insulating layer covering the light shielding member; and
a third insulating layer on the second insulating layer,
wherein the second insulating layer comprises an organic insulating material, and
wherein the third insulating layer comprises an inorganic insulating material.

* * * * *